(12) United States Patent
Yuan et al.

(10) Patent No.: US 11,250,784 B2
(45) Date of Patent: Feb. 15, 2022

(54) SHIFT REGISTER, DRIVING METHOD THEREOF, GATE DRIVE CIRCUIT, ARRAY SUBSTRATE AND DISPLAY DEVICE

(71) Applicants: Hefei BOE Joint Technology Co.,Ltd., Anhui (CN); BOE Technology Group Co., Ltd., Beijing (CN)

(72) Inventors: Zhidong Yuan, Beijing (CN); Yongqian Li, Beijing (CN); Meng Li, Beijing (CN); Can Yuan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/642,469

(22) PCT Filed: Jul. 29, 2019

(86) PCT No.: PCT/CN2019/098231
§ 371 (c)(1),
(2) Date: Feb. 27, 2020

(87) PCT Pub. No.: WO2020/098310
PCT Pub. Date: May 22, 2020

(65) Prior Publication Data
US 2021/0150988 A1    May 20, 2021

(30) Foreign Application Priority Data
Nov. 13, 2018   (CN) .......................... 201811345139.4

(51) Int. Cl.
*G09G 3/3266*    (2016.01)
*G11C 19/28*    (2006.01)

(52) U.S. Cl.
CPC ........... *G09G 3/3266* (2013.01); *G11C 19/28* (2013.01); *G09G 2300/0426* (2013.01); *G09G 2310/0286* (2013.01); *G09G 2310/08* (2013.01)

(58) Field of Classification Search
CPC .... G11C 19/28; G09G 3/2092; G09G 3/3677; G09G 3/3674; G09G 3/3266;
(Continued)

(56) References Cited

U.S. PATENT DOCUMENTS 9,293,093 B2 * 3/2016 Kim .................... G09G 3/3677
10,847,082 B2 * 11/2020 Kim ........................ G09G 3/32
(Continued)

FOREIGN PATENT DOCUMENTS

CN          102097132 A          6/2011
CN          104700789 A          6/2015
(Continued)

OTHER PUBLICATIONS

Office Action for corresponding Chinese Application No. 201811345139.4 dated Oct. 10, 2020.

*Primary Examiner* — Christopher E Leiby
(74) *Attorney, Agent, or Firm* — Arent Fox LLP; Michael Fainberg

(57) ABSTRACT

The present disclosure discloses a shift register, a driving method thereof, a gate drive circuit, an array substrate and a display device. With a signal control circuit, a branch control circuit, a cascade signal output circuit and at least two scan signal output circuits, each shift register can output at least two scan signals to correspond to different gate lines in a display panel. This can reduce the number of shift registers in a gate drive circuit and the space occupied by the gate drive circuit and can achieve an ultra-narrow frame design, as compared with an existing shift register that can
(Continued)

only output one scan signal. Moreover, as signals of different output control node do not influence each other, the output stability can also be improved.

19 Claims, 15 Drawing Sheets

(58) Field of Classification Search
CPC ....... G09G 2310/08; G09G 2310/0286; G09G 2300/0426; G09G 2300/08; G09G 2320/0223; G09G 2320/0219; G02F 1/1345
See application file for complete search history.

(56) References Cited

U.S. PATENT DOCUMENTS

| | | | | |
|---|---|---|---|---|
| 2006/0061385 | A1* | 3/2006 | Jinta | G09G 3/3677 326/81 |
| 2007/0146289 | A1* | 6/2007 | Lee | G09G 3/3677 345/100 |
| 2011/0141075 | A1 | 6/2011 | Chiang | |
| 2011/0273417 | A1* | 11/2011 | Shin | G09G 3/20 345/211 |
| 2013/0033468 | A1* | 2/2013 | Takahashi | G09G 3/3674 345/204 |
| 2013/0135284 | A1* | 5/2013 | Tseng | G11C 19/28 345/212 |
| 2013/0173870 | A1* | 7/2013 | Tseng | G09G 3/3677 711/154 |
| 2015/0002504 | A1* | 1/2015 | Jo | G09G 3/3677 345/213 |
| 2015/0077319 | A1 | 3/2015 | Yao et al. | |
| 2015/0077407 | A1* | 3/2015 | Kim | G09G 3/3677 345/204 |
| 2017/0004760 | A1* | 1/2017 | Jang | G11C 19/28 |
| 2017/0186373 | A1* | 6/2017 | Nishikawa | G09G 3/3233 |
| 2017/0309238 | A1 | 10/2017 | Sung et al. | |

FOREIGN PATENT DOCUMENTS

| | | |
|---|---|---|
| CN | 105788555 A | 7/2016 |
| CN | 106328063 A | 1/2017 |
| CN | 106782267 A | 5/2017 |
| CN | 108231034 A | 6/2018 |
| CN | 108597438 A | 9/2018 |

\* cited by examiner

In the input phase, the signal control circuit controls a signal of a first node and a signal of a second node in response to a signal of the input signal terminal; the branch control circuit controls signals of output control nodes in one-to-one correspondence with the scan signal output circuits in response to the signal of the first node; the cascade signal output circuit controls the cascade signal output terminal to output a cascade signal in response to the signal of one output control node; and each of the scan signal output circuits outputs a different scan signal in response to the signal of the corresponding output control node — S1301

In the output phase, the branch control circuit controls signals of the output control nodes in one-to-one correspondence with the scan signal output circuits in response to a signal of the first node; the cascade signal output circuit controls the cascade signal output terminal to output a cascade signal in response to the signal of one output control node; and each of the scan signal output circuits outputs a different scan signal in response to the signal of the corresponding output control node — S1302

In the reset phase, the signal control circuit controls signals of the first node and the second node in response to a reset signal; the cascade signal output circuit controls the cascade signal output terminal to output a cascade signal in response to a signal of one output control node; and each of the scan signal output circuits outputs a different scan signal in response to a signal of a corresponding output control node — S1303

Fig. 13

SHIFT REGISTER, DRIVING METHOD THEREOF, GATE DRIVE CIRCUIT, ARRAY SUBSTRATE AND DISPLAY DEVICE

This application is a US National Stage of International Application No. PCT/CN2019/098231, filed Jul. 29, 2019, which claims priority to Chinese Patent Application No. 201811345139.4, filed with Chinese Patent Office on Nov. 13, 2018, entitled "Shift Register Unit, Driving Method thereof, Gate Drive Circuit, and Related Device", which is incorporated herein by reference in its entirety.

FIELD

The present disclosure relates to the field of display technology, and particularly relates to a shift register, a driving method thereof, a gate drive circuit, an array substrate and a display device.

BACKGROUND

With the rapid development of display technology, display panels are increasingly developing towards high integration and a low cost. The gate driver on array (GOA) technology integrates a thin film transistor (TFT) gate drive circuit on an array substrate of a display panel to achieve scanning drive of the display panel, so that a wiring space for a bonding area and fan-out area of a gate integrated circuit (IC) can be omitted. A general gate drive circuit includes a plurality of cascaded shift registers, where the shift register in each stage is correspondingly connected to one gate line, so as to successively input scan signals to rows of gate lines on the display panel through the shift registers in the stages.

However, as each row of gate line is correspondingly connected to one shift register, the structural design of the gate drive circuit is complicated, and the space occupied by the display panel is large, which is not conducive to the design of a narrow frame.

SUMMARY

An embodiment of the present disclosure provides a shift register, including: a signal control circuit coupled to an input signal terminal and a reset signal terminal; a branch control circuit coupled to a first output terminal of the signal control circuit; a cascade signal output circuit coupled to a cascade signal output terminal and a second output terminal of the signal control circuit; and at least two scan signal output circuits, where one of the at least two scan signal output circuits is coupled to the second output terminal of the signal control circuit, at least one corresponding scan signal output terminal, and one corresponding output terminal of the branch control circuit.

Optionally, in an embodiment of the present disclosure, the cascade signal output circuit is coupled to one output terminal of the branch control circuit.

Optionally, in an embodiment of the present disclosure, the at least two scan signal output circuits include two scan signal output circuits, which are a first scan signal output circuit and a second scan signal output circuit; the first scan signal output circuit is coupled to a first output terminal of the branch control circuit; and the second scan signal output circuit is coupled to a second output terminal of the branch control circuit.

Optionally, in an embodiment of the present disclosure, the branch control circuit includes a first transistor and a second transistor; under the control of an effective level, the first transistor communicates the first output terminal of the signal control circuit with the first output terminal of the branch control circuit; and under the control of an effective level, the second transistor communicates the first output terminal of the signal control circuit with the second output terminal of the branch control circuit.

Optionally, in an embodiment of the present disclosure, a gate of the first transistor and a first electrode of the first transistor are coupled to the first output terminal of the signal control circuit, and a second electrode of the first transistor is the first output terminal of the branch control circuit; and a gate of the second transistor and a first electrode of the second transistor are coupled to the first output terminal of the signal control circuit, and a second electrode of the second transistor is the second output terminal of the branch control circuit.

Optionally, in an embodiment of the present disclosure, a gate of the first transistor is coupled to a first reference signal terminal, a first electrode of the first transistor is coupled to the first output terminal of the signal control circuit, and a second electrode of the first transistor is the first output terminal of the branch control circuit; and a gate of the second transistor is coupled to the first reference signal terminal, a first electrode of the second transistor is coupled to the first output terminal of the signal control circuit, and a second electrode of the second transistor is the second output terminal of the branch control circuit.

Optionally, in an embodiment of the present disclosure, the first scan signal output circuit includes at least one first sub-scan signal output circuit, where one of the at least one first sub-scan signal output circuit is coupled to a second reference signal terminal, one corresponding first clock signal terminal, and one corresponding first sub-scan signal output terminal, respectively.

Optionally, in an embodiment of the present disclosure, the first sub-scan signal output circuit includes a third transistor, a fourth transistor and a first capacitor; a gate of the third transistor is coupled to the first output terminal of the branch control circuit, a first electrode of the third transistor is coupled to the corresponding first clock signal terminal, and a second electrode of the third transistor is coupled to the corresponding first sub-scan signal output terminal; a gate of the fourth transistor is coupled to the second output terminal of the signal control circuit, a first electrode of the fourth transistor is coupled to the second reference signal terminal, and a second electrode of the fourth transistor is coupled to the corresponding first sub-scan signal output terminal; and the first capacitor is coupled between the gate of the third transistor and the corresponding first sub-scan signal output terminal.

Optionally, in an embodiment of the present disclosure, the second scan signal output circuit includes at least one second sub-scan signal output circuit, where one of the at least one second sub-scan signal output circuit is coupled to a second reference signal terminal, one corresponding second clock signal terminal, and one corresponding second sub-scan signal output terminal, respectively.

Optionally, in an embodiment of the present disclosure, the second sub-scan signal output circuit includes a fifth transistor, a sixth transistor and a second capacitor; a gate of the fifth transistor is coupled to the second output terminal of the branch control circuit, a first electrode of the fifth transistor is coupled to the corresponding second clock signal terminal, and a second electrode of the fifth transistor is coupled to the corresponding second sub-scan signal output terminal; a gate of the sixth transistor is coupled to the second output terminal of the signal control circuit, a first electrode of the sixth transistor is coupled to the second reference signal terminal, and a second electrode of the sixth transistor is coupled to the corresponding second sub-scan signal output terminal; and the second capacitor is coupled between the gate of the fifth transistor and the second sub-scan signal output terminal.

Optionally, in an embodiment of the present disclosure, the cascade signal output circuit includes a seventh transistor and an eighth transistor; a gate of the seventh transistor is coupled to the first output terminal of the branch control circuit, a first electrode of the seventh transistor is coupled to a third clock signal terminal, and a second electrode of the seventh transistor is coupled to the cascade signal output terminal; and a gate of the eighth transistor is coupled to the second output terminal of the signal control circuit, a first electrode of the eighth transistor is coupled to a third reference signal terminal, and a second electrode of the eighth transistor is coupled to the cascade signal output terminal.

Optionally, in an embodiment of the present disclosure, the signal control circuit includes an input circuit, a reset circuit, and a node control circuit; the input circuit is coupled to the input signal terminal, a first reference signal terminal and the first output terminal of the signal control circuit, respectively; the reset circuit is coupled to the reset signal terminal, a third reference signal terminal, and the first output terminal of the branch control circuit and the second output terminal of the branch control circuit, respectively; and the node control circuit is coupled to the first reference signal terminal, the third reference signal terminal, the first output terminal of the signal control circuit and the second output terminal of the signal control circuit, and the first output terminal of the branch control circuit and the second output terminal of the branch control circuit, respectively.

Optionally, in an embodiment of the present disclosure, the input circuit includes a ninth transistor, where a gate of the ninth transistor is coupled to the input signal terminal, a first electrode of the ninth transistor is coupled to the first reference signal terminal, and a second electrode of the ninth transistor is coupled to the first output terminal of the signal control circuit; the reset circuit includes a tenth transistor and an eleventh transistor, where a gate of the tenth transistor is coupled to the reset signal terminal, a first electrode of the tenth transistor is coupled to the third reference signal terminal, and a second electrode of the tenth transistor is coupled to the first output terminal of the branch control circuit; and a gate of the eleventh transistor is coupled to the reset signal terminal, a first electrode of the eleventh transistor is coupled to the third reference signal terminal, and a second electrode of the eleventh transistor is coupled to the second output terminal of the branch control circuit; and the node control circuit includes a twelfth transistor, a thirteenth transistor, a fourteenth transistor and a fifteenth transistor, where a gate of the twelfth transistor is coupled to the second output terminal of the signal control circuit, a first electrode of the twelfth transistor is coupled to the third reference signal terminal, and a second electrode of the twelfth transistor is coupled to the first output terminal of the branch control circuit; a gate of the thirteen transistor is coupled to the second output terminal of the signal control circuit, a first electrode of the thirteen transistor is coupled to the third reference signal terminal, and a second electrode of the thirteen transistor is coupled to the second output terminal of the branch control circuit; a gate of the fourteenth transistor and a first electrode of the fourteenth transistor are coupled to the first reference signal terminal, and a second electrode of the fourteenth transistor is coupled to the second output terminal of the signal control circuit; and a gate of the fifteenth transistor is coupled to the first output terminal of the signal control circuit, a first electrode of the fifteenth transistor is coupled to the third reference signal terminal, and a second electrode of the fifteenth transistor is coupled to the second output terminal of the signal control circuit.

Optionally, in an embodiment of the present disclosure, the reset circuit further includes a sixteenth transistor, where the first electrode of the tenth transistor and the first electrode of the eleventh transistor are coupled to the third reference signal terminal through the sixteenth transistor; and a gate of the sixteenth transistor is coupled to the reset signal terminal; and the node control circuit further includes a seventeenth transistor, where the first electrode of the twelfth transistor and the first electrode of the thirteenth transistor are respectively coupled to the third reference signal terminal through the seventeenth transistor; and a gate of the seventeenth transistor is coupled to the second output terminal of the signal control circuit.

Optionally, in an embodiment of the present disclosure, the shift register a detection circuit, where the detection circuit includes an eighteenth transistor, a nineteenth transistor, a twentieth transistor, a twenty-first transistor, a twenty-second transistor and a third capacitor; a gate of the eighteenth transistor is coupled to a first detection control signal terminal, a first electrode of the eighteenth transistor is coupled to the input signal terminal, and a second electrode of the eighteenth transistor is coupled to a first electrode of the twentieth transistor; a gate of the nineteenth transistor is coupled to the first detection control signal terminal, a first electrode of the nineteenth transistor is coupled to a gate of the twenty-first transistor, and a second electrode of the nineteenth transistor is coupled to the first electrode of the twentieth transistor; a gate of the twentieth transistor is coupled to the gate of the twenty-first transistor, and a second electrode of the twentieth transistor is coupled to a fourth reference signal terminal; a first electrode of the twenty-first transistor is coupled to the fourth reference signal terminal, and a second electrode of the twenty-first transistor is coupled to a first electrode of the twenty-second transistor; a gate of the twenty-second transistor is coupled to a second detection control signal terminal, and a second electrode of the twenty-second transistor is coupled to the first output terminal of the signal control circuit; and the third capacitor is coupled between the first electrode of the twenty-first transistor and the gate of the twenty-first transistor.

Correspondingly, an embodiment of the present disclosure also provides a gate drive circuit, including a plurality of cascaded shift registers provided in the above embodiments of the present disclosure; an input signal terminal of a first-stage shift register is coupled to a frame start signal terminal; in every adjacent four stages of shift registers, an input signal terminal of a fourth-stage shift register is coupled to a cascade signal input terminal of the first-stage shift register; and in every adjacent five stages of shift registers, a reset signal terminal of the first-stage shift register is coupled to a cascade signal input terminal of a fifth-stage shift register.

Correspondingly, an embodiment of the present disclosure also provides an array substrate, including the gate drive circuit provided in an embodiment of the present disclosure.

Correspondingly, an embodiment of the present disclosure also provides a display device, including the array substrate provided in an embodiment of the present disclosure.

Correspondingly, an embodiment of the present disclosure also provides a driving method of the shift register provided in an embodiment of the present disclosure, including a display scanning phase, where the display scanning phase includes an input phase, an output phase and a reset phase; in the input phase, the signal control circuit controls a signal of the first output terminal of the signal control circuit and a signal of the second output terminal of the signal control circuit in response to a signal of the input signal terminal; the branch control circuit controls output signals of output terminals of the branch control circuit in response to the signal of the first output terminal of the signal control circuit; the cascade signal output circuit controls the cascade signal output terminal to output a cascade signal in response to the output signal of one output terminal of the branch control circuit; and each of the scan signal output circuits controls at least one corresponding scan signal output terminal to output a different scan signal in response to the signal of one corresponding output terminal of the branch control circuit; in the output phase, the branch control circuit controls output signals of output terminals of the branch control circuit in response to a signal of the first output terminal of the signal control circuit; the cascade signal output circuit controls the cascade signal output terminal to output a cascade signal in response to the output signal of one output terminal of the branch control circuit; and each of the scan signal output circuits controls at least one corresponding scan signal output terminal to output a different scan signal in response to the signal of one corresponding output terminal of the branch control circuit; and in the reset phase, the signal control circuit controls signals of the first output terminal and the second output terminal of the signal control circuit in response to a signal of the reset signal terminal; the cascade signal output circuit controls the cascade signal output terminal to output a cascade signal in response to the output signal of one output terminal of the branch control circuit; and each of the scan signal output circuits outputs a different scan signal in response to a signal of a corresponding output control node.

Optionally, in an embodiment of the present disclosure, the scan signal output circuits include two scan signal output circuits, which are a first scan signal output circuit and a second scan signal output circuit; the first scan signal output circuit includes a plurality of first sub-scan signal output circuits; and the second scan signal output circuit includes a plurality of second sub-scan signal output circuits; in the input phase and the output phase, each of the first sub-scan signal output circuits provides a signal of a corresponding first clock signal terminal to a corresponding first sub-scan signal output terminal in response to a signal of a first output terminal of the branch control circuit; each of the second sub-scan signal output circuits provides a signal of a corresponding second clock signal terminal to a corresponding second sub-scan signal output terminal in response to a signal of a second output terminal of the branch control circuit; and the cascade signal output circuit provides a signal of a third clock signal terminal to the cascade signal output terminal in response to a signal of the first output terminal of the branch control circuit; and in the reset phase, each of the first sub-scan signal output circuits provides a signal of a second reference signal terminal to a corresponding first sub-scan signal output terminal in response to a signal of the second output terminal of the signal control circuit; each of the second sub-scan signal output circuits provides the signal of the second reference signal terminal to a corresponding second sub-scan signal output terminal in response to the signal of the second output terminal of the signal control circuit; and the cascade signal output circuit provides a signal of a third reference signal terminal to the cascade signal output terminal in response to the signal of the second output terminal of the signal control circuit.

Optionally, in an embodiment of the present disclosure, in the display scanning phase, signal timings of the first clock signal terminals are same, and signal timings of the second clock signal terminals are same, and the signal timings of the first clock signal terminals are different from those of the second clock signal terminals.

BRIEF DESCRIPTION OF THE DRAWINGS

FIG. 13 is a flow diagram of a driving method provided in some embodiments of the present disclosure.

DETAILED DESCRIPTION OF THE EMBODIMENTS

Figure 1:
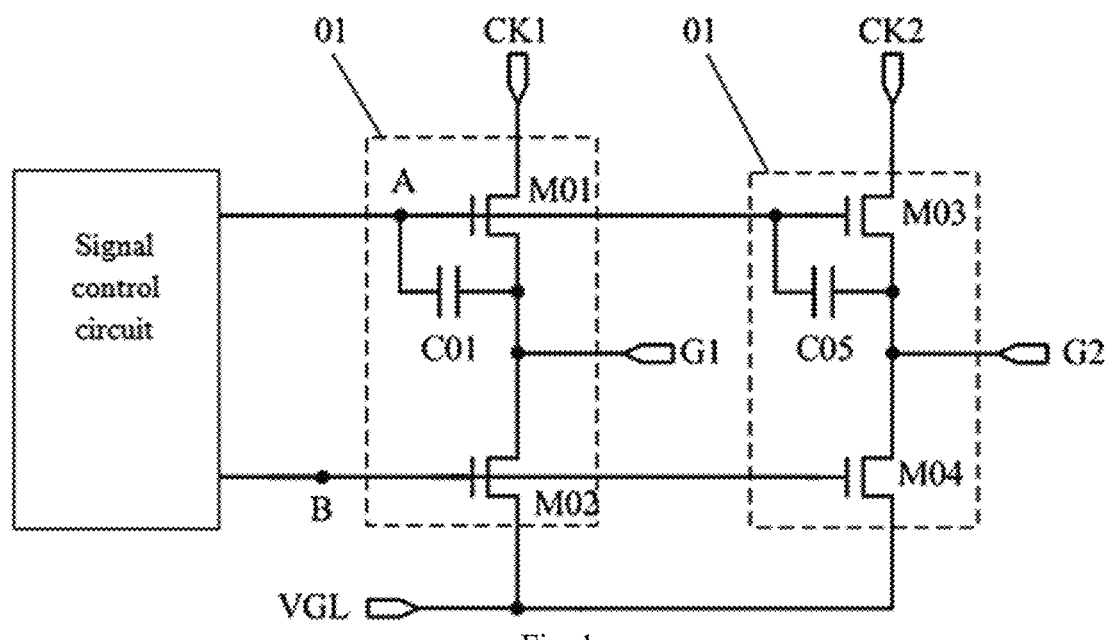
FIG. 1 is a structure diagram of a shift register in the related art.

To make the object, technical solutions and advantages of the present disclosure more apparent, specific implementations of a shift register, a driving method thereof, a gate drive circuit and a display device provided in embodiments of the present disclosure are described in detail below in conjunction with the accompanying drawings. It should be understood that the preferred embodiments described below are only used for illustrating and explaining the present disclosure, instead of limiting the present disclosure. Moreover, the embodiments in the present disclosure and the features in the embodiments can be combined with each other without conflict. It should be noted that the shapes in the drawings do not reflect the true scale, and are merely intended to schematically illustrate the present disclosure.

Furthermore, same or similar reference numerals throughout represent same or similar elements or elements having same or similar functions.

As shown in FIG. 1, to output a plurality of scan signals, a shift register can be provided with a plurality of scan signal output circuits 01. For example, two scan signal output circuits 01 are provided in FIG. 1, where one scan signal output circuit 01 outputs a scan signal G1, and the other scan signal output circuit 01 outputs a scan signal G2. Specifically, a signal of a pull-up node A and a signal of a pull-down node B are controlled by a signal control circuit.

The scan signal output circuit 01 that outputs the scan signal G1 includes transistors M01 and M02, and a capacitor C01. A gate of the transistor M01 is coupled to the pull-up node A, and a first electrode of the transistor M01 is configured to receive a clock signal CK1, and a second electrode of the transistor M01 is configured to output the scan signal G1. A gate of the transistor M02 is coupled to the pull-down node B, and a first electrode of the transistor M02 is configured to receive a signal VGL, and a second electrode of the transistor M02 is coupled to the second electrode of the transistor M01. The capacitor C01 is coupled between the pull-up node A and the second electrode of the transistor M01.

The scan signal output circuit 01 that outputs the scan signal G2 includes transistors M03 and M04, and a capacitor C02. A gate of the transistor M03 is coupled to the pull-up node A, and a first electrode of the transistor M03 is configured to receive a clock signal CK2, and a second electrode of the transistor M03 is configured to output the scan signal G2. A gate of the transistor M04 is coupled to the pull-down node B, and a first electrode of the transistor M04 is configured to receive the signal VGL, and a second electrode of the transistor M04 is coupled to the second electrode of the transistor M03. The capacitor C02 is coupled between the pull-up node A and the second electrode of the transistor M03.

Under the control of the signal of the pull-up node A, the transistor M01 can provide a signal of the clock signal CK1 to a second terminal thereof to be output as the scan signal G1. Under the control of the signal of the pull-up node A, the transistor M03 can provide a signal of the clock signal CK2 to a second terminal thereof to be output as the scan signal G2.

Figure 2:
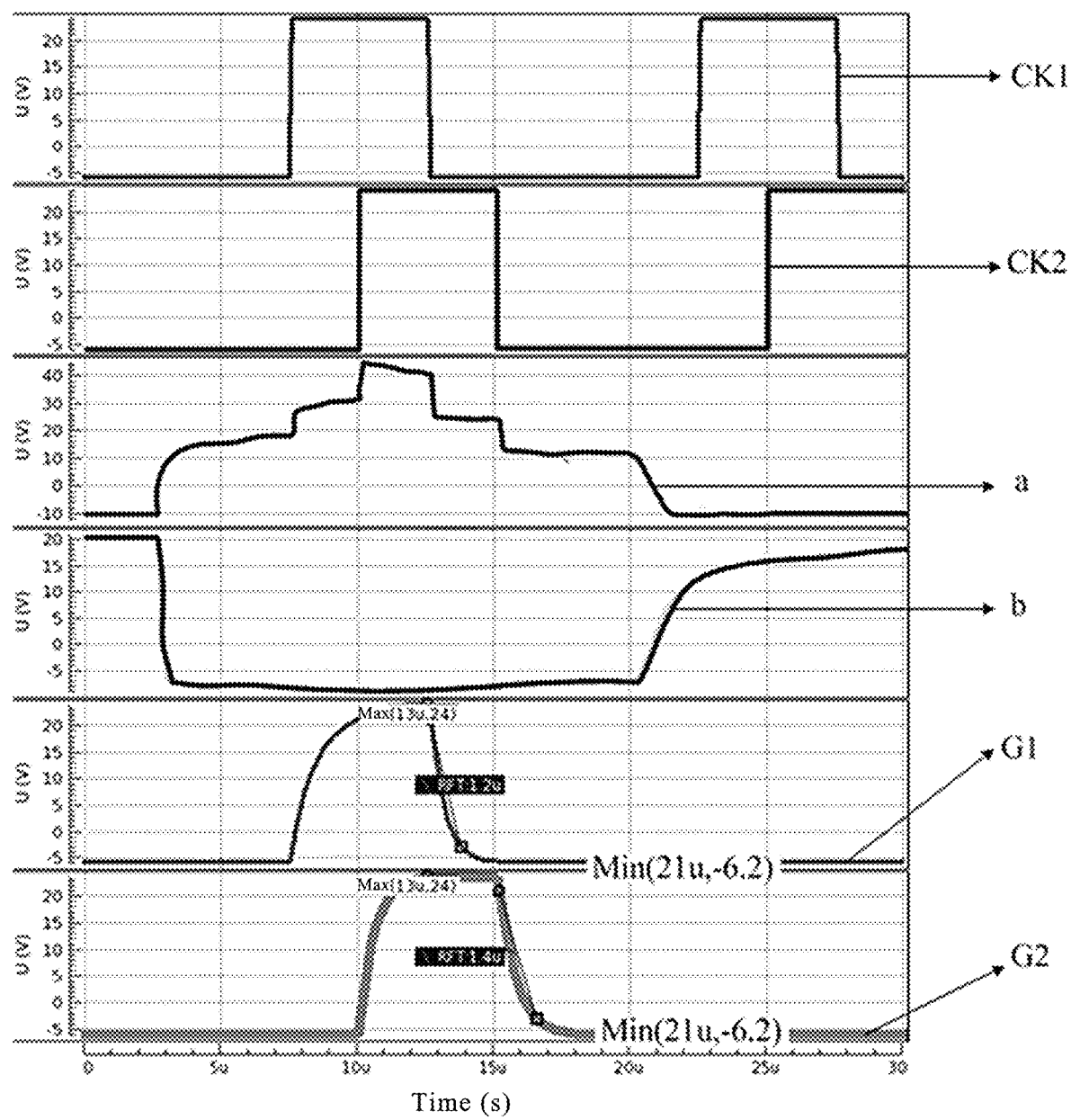
FIG. 2 is a signal simulation diagram of the shift register shown in FIG. 1.

A simulation timing diagram, as shown in FIG. 2, can be obtained by simulating the clock signals CK1, CK2, the signal a from the pull-up node A, the signal b from the pull-down node B, and the scan signals G1 and G2. Since a high level of the clock signal CK1 appears earlier than a high level of the clock signal CK2, when the transistor M01 is turned on under the control of the signal of the pull-up node A to use a high-level signal of the clock signal CK1 as the scan signal G1 for output, the level of pull-up node A can be pulled up. When the transistor M03 is turned on under the control of the signal of the pull-up node A to use a high-level signal of the clock signal CK2 as the scan signal G2 for output, the level of the pull-up node A can be further pulled up. Since the transistor M01 and the transistor M03 are controlled by the signal a from the same pull-up node A, and the high level of the clock signal CK1 is changed to a low level earlier, the fall time RFT (12 us) for the scan signal G1 to be restored from a high level to a low level is less than the fall time RFT (14 us) for the scan signal G2 to be restored from a high level to a low level, resulting in a difference in the waveforms of the output scan signals G1 and G2.

Figure 3:
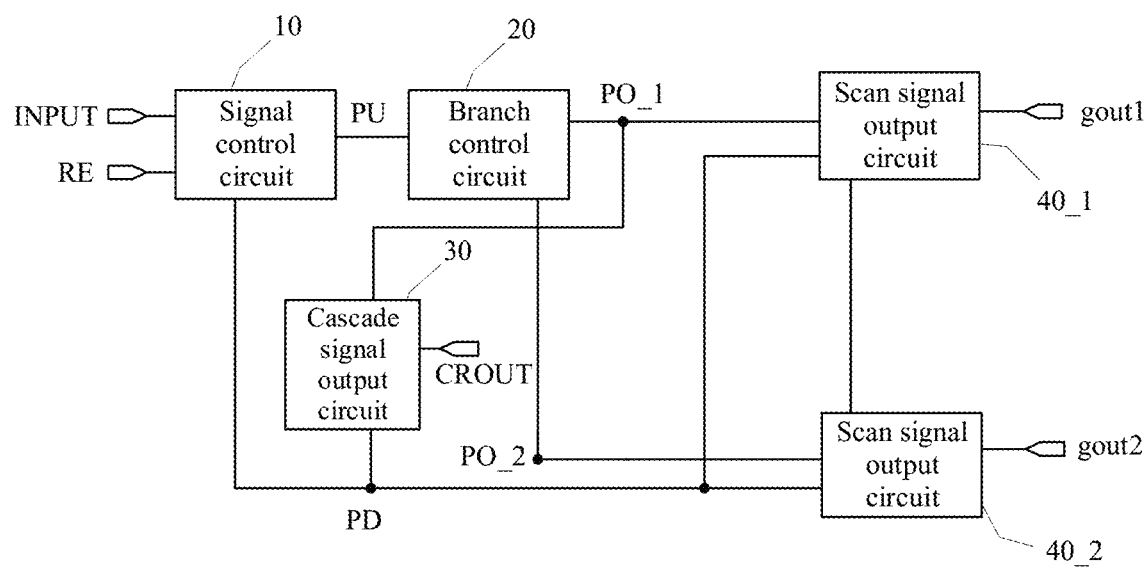
FIG. 3 is a structure diagram of a shift register provided in some embodiments of the present disclosure.

Based on this, some embodiments of the present disclosure provide a shift register, as shown in FIG. 3. The shift register includes a signal control circuit 10, a branch control circuit 20, a cascade signal output circuit 30, and at least two scan signal output circuits 40_$m$ (1≤m≤M, where M represents the total number of the scan signal output circuits, and FIG. 3 uses M=2 as an example).

The signal control circuit 10 is coupled to an input signal terminal INPUT and a reset signal terminal RE; that is, the signal control circuit 10 is configured to control signals of a first output terminal and a second output terminal of the signal control circuit 10 in response to a signal of the input signal terminal INPUT and a signal of the reset signal terminal RE. For convenience of description, the first output terminal of the signal control circuit 10 is referred to as a first node PU, and the second output terminal of the signal control circuit 10 is referred to as a second node PD.

The branch control circuit 20 is coupled to the first output terminal of the signal control circuit 10; that is, the branch control circuit 20 is configured to control signals of output control nodes PO_m in one-to-one correspondence with the scan signal output circuits 40_$m$ in response to the signal of the first node PU. For convenience of description, output terminals of the branch control circuit 20 are referred to as output control nodes PO_m.

The cascade signal output circuit 30 is coupled to a cascade signal output terminal CROUT, one output terminal of the branch control circuit 20 and the second output terminal of the signal control circuit 10, respectively; that is, the cascade signal output circuit 30 is configured to output a cascade signal CR in response to a signal of an output control node PO_1 corresponding to a first scan output circuit in a plurality of scan signal output circuits and a signal of a second node PD.

Each scan signal output circuit 40_$m$ is coupled to the second output terminal of the signal control circuit 10, at least one corresponding scan signal output terminal goutm, and one corresponding output terminal of the branch control circuit 20, respectively; that is, each scan signal output circuit 40_$m$ is configured to output a different scan signal goutm in response to a signal of the corresponding output control node PO_m and the signal of the second node PD.

In the shift register provided in the embodiments of the present disclosure, the signal control circuit controls the signal of the first node and the signal of the second node in response to the signal of the input signal terminal and the signal of the reset signal terminal. In response to the signal of the first node, the branch control circuit is configured to control the signals of the output control nodes in one-to-one correspondence with the respective scan signal output circuits. In this way, the different output control nodes can be separated, so that when the signal of an output control node changes, the signal(s) of other output control node(s) can be unaffected.

The cascade signal output circuit outputs the cascade signal in response to the signal of the output control node corresponding to the first scan output circuit in the plurality of scan signal output circuits and the signal of the second node PD, so as to provide an input signal to a next-stage shift register.

The plurality of scan signal output circuits are provided so that each scan signal output circuit outputs a different scan signal in response to the signal of the corresponding output control node and the signal of the second node. This allows each shift register to output multiple scan signals to correspond to different gate lines in a display panel. This can reduce the number of shift registers in a gate drive circuit and the space occupied by the gate drive circuit, and can achieve an ultra-narrow frame design, as compared with a shift register that can only output one scan signal in the related art. Moreover, as the signals of different output control nodes do not influence each other, the output stability can also be improved.

Figure 4:
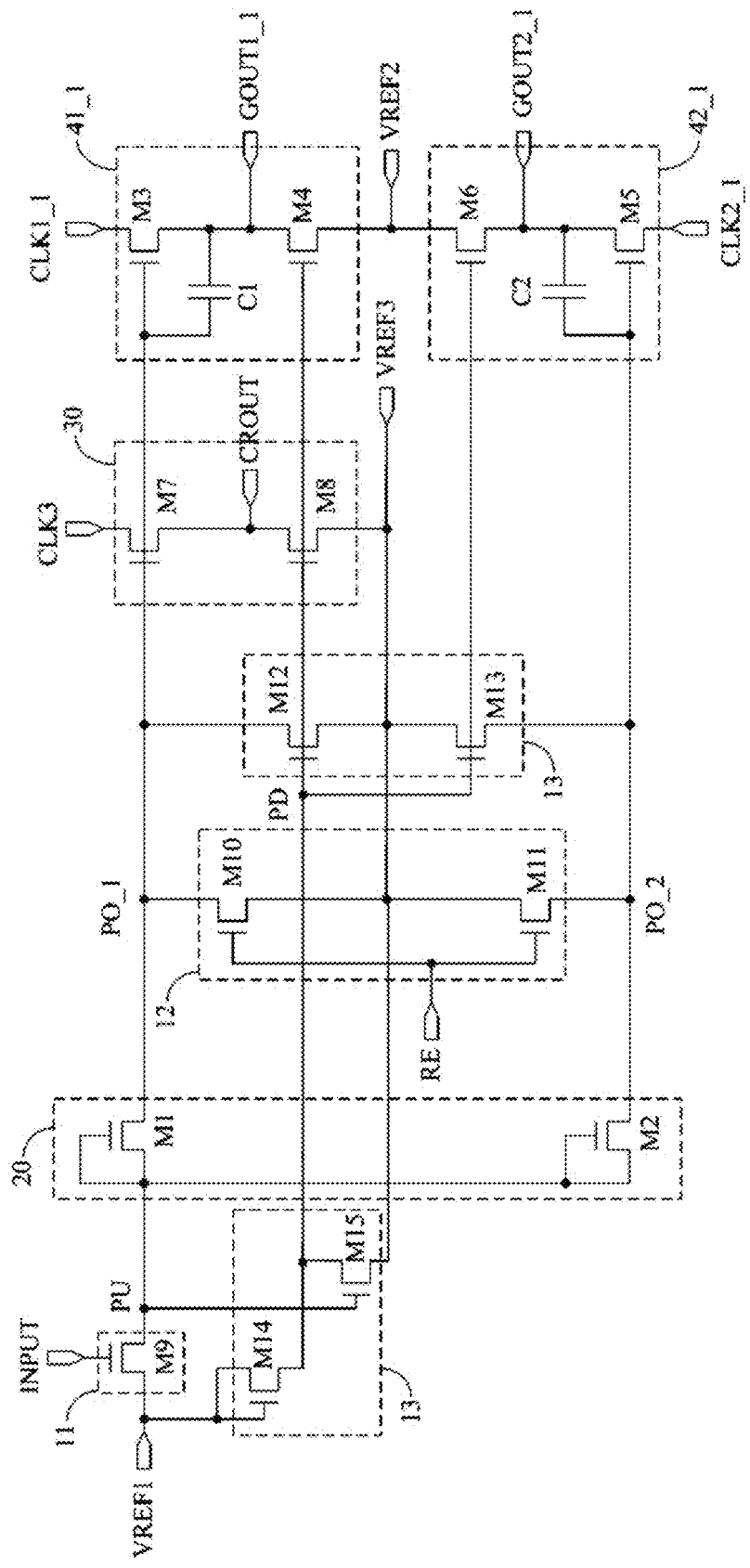
FIG. 4 is a specific structure diagram of a shift register provided in some embodiments of the present disclosure.

In specific implementation, in an embodiment of the present disclosure, as shown in FIG. 4, the signal control circuit 10 includes: an input circuit 11, a reset circuit 12 and a node control circuit 13, so that the levels of the signals of the first node PU, the output control nodes PO_m and the second node PD can be controlled through mutual cooperation of the input circuit 11, the reset circuit 12 and the node control circuit 13.

The input circuit 11 is coupled to the input signal terminal INPUT, a first reference signal terminal VREF1, and the first output terminal of the signal control circuit, respectively. The input circuit 11 is configured to provide a signal of the first reference signal terminal VREF1 to the first node PU in response to the signal of the input signal terminal INPUT.

The reset circuit 12 is coupled to the reset signal terminal RE, a third reference signal terminal VREF3, and the first output terminal and the second output terminal of the branch control circuit 20, respectively. The reset circuit 12 is configured to provide a signal of the third reference signal terminal VREF3 to the output control node PO_m corresponding to the scan signal output circuit 40_m in response to the signal of the reset signal terminal RE.

The node control circuit 13 is coupled to the first reference signal terminal VREF1, the third reference signal terminal VREF3, the first output terminal and the second output terminal of the signal control circuit 10, and the first output terminal and the second output terminal of the branch control circuit 20, respectively. The node control circuit 13 is configured to control the levels of the signal of the first node PU and the signals of the output control nodes PO_m to be respectively opposite to the level of the signal of the second node PD.

In specific implementation, in an embodiment of the present disclosure, as shown in FIG. 4, the cascade signal output circuit 30 is configured to provide a signal of a third clock signal terminal CLK3 to the cascade signal output terminal CROUT in response to the signal of the output control node PO_1 corresponding to the first scan output circuit 40_1 in the plurality of scan signal output circuits; and provide the signal of the third reference signal terminal VREF3 to the cascade signal output terminal CROUT in response to the signal of the second node PD.

The present disclosure is described in detail below in conjunction with specific embodiments. It should be noted that the embodiments are intended to better explain the present disclosure, but do not limit the present disclosure.

Embodiment 1

In specific implementation, in the embodiments of the present disclosure, as shown in FIGS. 3 and 4, two scan signal output circuits 40_m may be provided. Alternatively, three, four, five or other number of scan signal output circuits 40_m may also be provided. Of course, in practical applications, the number of the scan signal output circuits 40_m can be designed and determined according to an actual application environment, and is not limited herein.

In the following description, the number of the scan signal output circuits 40_m is set to two as an example.

In specific implementation, in the embodiment of the present disclosure, as shown in FIG. 4, a first scan signal output circuit 40_1 of the two scan signal output circuits includes at least one first sub-scan signal output circuit 41_n (1≤n≤N, where N represents the total number of the first sub-scan signal output circuits, and FIG. 4 uses N=1 as an example). One first sub-scan signal output circuit 41_n is coupled to a second reference signal terminal VREF2, one corresponding first clock signal terminal CLK1_n, and one corresponding first sub-scan signal output terminal GOUT1_n, respectively; and each first sub-scan signal output circuit 41_n is in one-to-one correspondence with one first clock signal terminal CLK1_n, and each first sub-scan signal output circuits 41_n is in one-to-one correspondence with one first sub-scan signal output terminal GOUT1_n. Moreover, the first sub-scan signal output circuit 41_n is configured to provide a signal of the corresponding first clock signal terminal CLK1_n to the corresponding first sub-scan signal output terminal GOUT1_n in response to a signal of the same output control node, that is, the first sub-scan signal output circuit 41_n is configured to provide a signal of the corresponding first clock signal terminal CLK1_n to the corresponding first sub-scan signal output terminal GOUT1_n in response to a signal of an output control node PO_1; and provide a signal of the second reference signal terminal VREF2 to the corresponding first sub-scan signal output terminal GOUT1_n in response to a signal of a second node PD. Furthermore, the first sub-scan signal output terminal GOUT1_n respectively outputs a scan signal gout1_n.

Further, in specific implementation, as shown in FIG. 4, one first sub-scan signal output circuit may be provided; or two first sub-scan signal output circuits may be provided. In practical applications, the specific number of the first sub-scan signal output circuit can be designed and determined according to an actual application environment, and is not limited herein. In the following description, one first sub-scan signal output circuit is provided as an example.

In specific implementation, in the embodiments of the present disclosure, as shown in FIG. 4, a second scan signal output circuit 40_2 of the two scan signal output circuits includes at least one second sub-scan signal output circuit 42_k (1≤k≤K, where K represents the total number of the second sub-scan signal output circuits, and FIG. 4 uses K=1 as an example). One second sub-scan signal output circuit 42_k is coupled to the second reference signal terminal VREF2, one corresponding second clock signal terminal CLK2_k, and one corresponding second sub-scan signal output terminal, respectively; and each second sub-scan signal output circuit 42_k is in one-to-one correspondence with one second clock signal terminal CLK2_k, and each second sub-scan signal output circuit 42_k is in one-to-one correspondence with one second sub-scan signal output terminal GOUT2_k. Moreover, the second sub-scan signal output circuit 42_k is configured to provide a signal of the corresponding second clock signal terminal CLK2_k to the corresponding second sub-scan signal output terminal GOUT2_k in response to a signal of the same output control node, that is, the second sub-scan signal output circuit 42_k is configured to provide a signal of the corresponding second clock signal terminal CLK2_k to the corresponding second sub-scan signal output terminal GOUT2_k in response to a signal of an output control node PO_2; and provide the signal of the second reference signal terminal VREF2 to the corresponding second sub-scan signal output terminal GOUT2_k in response to the signal of the second node PD. Furthermore, the second sub-scan signal output terminal GOUT2_k respectively outputs a scan signal gout2_k.

Further, in specific implementation, as shown in FIG. 4, one second sub-scan signal output circuit may be provided; or two second sub-scan signal output circuits may be provided. In practical applications, the specific number of the second sub-scan signal output circuit can be designed and determined according to the actual application environment, and is not limited herein. In the following description, one second sub-scan signal output circuit is provided as an example.

Further in a specific implementation, in the embodiments of the present disclosure, it may be set N=K, and n=k.

In specific implementation, in the embodiments of the present disclosure, as shown in FIG. 4, the branch control circuit 20 includes: a first transistor M1 and a second transistor M2; under the control of an effective level, the first transistor M1 communicates a first output terminal of the signal control circuit 10 with a first output terminal of the branch control circuit 20; and under the control of an effective level, the second transistor M2 communicates the first output terminal of the signal control circuit 10 with a second output terminal of the branch control circuit 20.

Specifically, a gate of the first transistor M1 and a first electrode of the first transistor M1 are coupled to a first node PU, and a second electrode of the first transistor M1 is coupled to the output control node PO_1 corresponding to the first scan signal output circuit 40_1 of the two scan signal output circuits; and a gate of the second transistor M2 and a first electrode of the second transistor M2 are coupled to the first node PU, and a second electrode of the second transistor M2 is coupled to the output control node PO_2 corresponding to the second scan signal output circuit 40_2 of the two scan signal output circuits.

In specific implementation, since the gate of the first transistor M1 is coupled to the first electrode thereof, the first transistor M1 forms a diode connection. In this way, when the voltage of the gate of the first transistor M1 is greater than that of the second electrode thereof, the first transistor M1 can form a closed circuit, so that the first node PU and the output control node PO_1 are in conduction; and when the voltage of the gate of the first transistor M1 is not greater than that of the second electrode thereof, the first transistor M1 can form an open circuit, so that the first node PU and the output control node PO_1 are disconnected. Likewise, when the voltage of the gate of the second transistor M2 is greater than that of the second electrode thereof, the second transistor M2 can form a closed circuit, so that the first node PU and the output control node PO_2 are in conduction; and when the voltage of the gate of the second transistor M2 is not greater than that of the second electrode thereof, the second transistor M2 can form an open circuit, so that the first node PU and the output control node PO_2 are disconnected.

In specific implementation, in the embodiments of the present disclosure, as shown in FIG. 4, the first sub-scan signal output circuit 41_$n$ includes a third transistor M3, a fourth transistor M4 and a first capacitor C1. A gate of the third transistor M3 is coupled to the corresponding output control node PO_1, and a first electrode of the third transistor M3 is configured to receive the signal of the corresponding first clock signal terminal CLK1_$n$, and a second electrode of the third transistor M3 is coupled to the corresponding first sub-scan signal output terminal GOUT1_$n$. A gate of the fourth transistor M4 is coupled to the second node PD, and a first electrode of the fourth transistor M4 is configured to receive the signal of the second reference signal terminal VREF2, and a second electrode of the fourth transistor M4 is coupled to the corresponding first sub-scan signal output terminal GOUT1_$n$. The first capacitor C1 is coupled between the gate of the third transistor M3, i.e., the corresponding output control node PO_1, and the first sub-scan signal output terminal GOUT1_$n$.

In specific implementation, in the embodiments of the present disclosure, the third transistor M3 in each first sub-scan signal output circuit 41_$n$ can be in an on state under the control of the signal of the output control node PO_1, so as to provide the signal of the corresponding first clock signal terminal CLK1_$n$ to the corresponding first sub-scan signal output terminal GOUT1_$n$. The fourth transistor M4 in each first sub-scan signal output circuit 41_$n$ can be in an on state under the control of the signal of the second node PD, so as to provide the signal of the second reference signal terminal VREF2 to the corresponding first sub-scan signal output terminal GOUT1_$n$. The first capacitor C1 can maintain the level of the connected output control node PO_1 and the level of the first sub-scan signal output terminal GOUT1_$n$, and can maintain a stable voltage difference between the output control node PO_1 and the first sub-scan signal output terminal GOUT1_$n$ when the output control node PO_1 is in a floating state.

In specific implementation, in the embodiments of the present disclosure, as shown in FIG. 4, the second sub-scan signal output circuit 42_$k$ includes a fifth transistor M5, a sixth transistor M6 and a second capacitor C2. A gate of the fifth transistor M5 is coupled to the corresponding output control node PO_2, and a first electrode of the fifth transistor M5 is configured to receive the signal of the corresponding second clock signal terminal CLK2_$k$, and a second electrode of the fifth transistor M5 is coupled to the corresponding second sub-scan signal output terminal GOUT2_$k$. A gate of the sixth transistor M6 is coupled to the second node PD, and a first electrode of the sixth transistor M6 is configured to receive the signal of the second reference signal terminal VREF2, and a second electrode of the sixth transistor M6 is coupled to the corresponding to the second sub-scan signal output terminal GOUT2_$k$. The second capacitor C2 is coupled between the corresponding output control node PO_2, and the second sub-scan signal output terminal GOUT2_$k$.

In specific implementation, in the embodiments of the present disclosure, the fifth transistor M5 in each second sub-scan signal output circuit 42_$k$ can be in an on state under the control of the signal of the output control node PO_2, so as to provide the signal of the corresponding second clock signal terminal CLK2_$k$ to the corresponding second sub-scan signal output terminal GOUT2_$k$. The sixth transistor M6 in each second sub-scan signal output circuit 42_$k$ can be in an on state under the control of the signal of the second node PD, so as to provide the signal of the second reference signal terminal VREF2 to the corresponding second sub-scan signal output terminal GOUT2_$k$. The second capacitor C2 can maintain the level of the connected output control node PO_2 and the level of the second sub-scan signal output terminal GOUT2_$k$, and can maintain a stable voltage difference between the output control node PO_2 and the second sub-scan signal output terminal GOUT2_$k$ when the output control node PO_2 is in a floating state.

In specific implementation, in the embodiments of the present disclosure, as shown in FIG. 4, the input circuit 11 includes a ninth transistor M9. A gate of the ninth transistor M9 is configured to receive a signal of an input signal terminal INPUT, and a first electrode of the ninth transistor M9 is configured to receive a signal of a first reference signal terminal VREF1, and a second electrode of the ninth transistor M9 is coupled to the first node PU. The ninth transistor M9 can be in an on state under the control of the signal of the input signal terminal INPUT, so as to provide the signal of the first reference signal terminal VREF1 to the first node PU.

In specific implementation, in the embodiments of the present disclosure, as shown in FIG. 4, the reset circuit 12 includes a tenth transistor M10 and an eleventh transistor M11. A gate of the tenth transistor M10 is configured to receive a signal of a reset signal terminal RE, and a first electrode of the tenth transistor M10 is configured to receive a signal of the third reference signal terminal VREF3, and a second electrode of the tenth transistor M10 is coupled to an output control node, i.e., the output control node PO_1. A gate of the eleventh transistor M11 is configured to receive the signal of the reset signal terminal RE, and a first electrode of the eleventh transistor M11 is configured to receive the signal of the third reference signal terminal VREF3, and a second electrode of the eleventh transistor M11 is coupled to another output control node, i.e., the output control node PO_2. The tenth transistor M10 can be in an on state under the control of an effective pulse signal of the reset signal terminal RE, so as to provide the signal of the third reference signal terminal VREF3 to the output control node PO_1. The eleventh transistor M11 can be in an on state under the control of the reset signal terminal RE, so as to provide the signal of the third reference signal terminal VREF3 to the output control node PO_2.

In specific implementation, in the embodiments of the present disclosure, as shown in FIG. 4, the node control circuit 13 includes a twelfth transistor M12, a thirteenth transistor M13, a fourteenth transistor M14 and a fifteenth transistor M15.

A gate of the twelfth transistor M12 is coupled to the second node PD, a first electrode of the twelfth transistor M12 is configured to receive the signal of the third reference signal terminal VREF3, and a second electrode of the twelfth transistor M12 is coupled to an output control node, i.e., the output control node PO_1.

A gate of the thirteenth transistor M13 is coupled to the second node PD, a first electrode of the thirteenth transistor M13 is configured to receive the signal of the third reference signal terminal VREF3, and a second electrode of the thirteenth transistor M13 is coupled to another output control node, i.e., the output control node PO_2.

A gate and a first gate of the fourteenth transistor M14 are configured to receive the signal of the first reference signal terminal VREF1, and a second electrode of the fourteenth transistor M14 is coupled to the second node PD.

A gate of the fifteenth transistor M15 is coupled to the first node PU, a first electrode of the fifteenth transistor M15 is configured to receive the signal of the third reference signal terminal VREF3, and a second electrode of the fifteenth transistor M15 is coupled to the second node PD.

The twelfth transistor M12 can be in an on state under the control of the signal of the second node PD, so as to provide the signal of the third reference signal terminal VREF3 to the output control node PO_1. The thirteenth transistor M13 can be in an on state under the control of the signal of the second node PD, so as to provide the signal of the third reference signal terminal VREF3 to the output control node PO_2. The fourteenth transistor M14 and the fifteenth transistor M15 can form an inverter so that the level of the second node PD and the level of the first node PU are opposite.

In specific implementation, in the embodiments of the present disclosure, as shown in FIG. 4, the cascade signal output circuit 30 includes a seventh transistor M7 and an eighth transistor M8.

A gate of the seventh transistor M7 is coupled to the output control node PO_1 corresponding to the first scan signal output circuit, and a first electrode of the seventh transistor M7 is configured to receive a signal of a third clock signal terminal CLK3, and a second electrode of the seventh transistor M7 is coupled to a cascade signal output terminal CROUT.

A gate of the eighth transistor M8 is coupled to the second node PD, and a first electrode of the eighth transistor M8 is configured to receive the signal of the third reference signal terminal VREF3, and a second electrode of the eighth transistor M8 is coupled to the cascade signal output terminal CROUT. A third capacitor C3 is coupled between the first node PU and the cascade signal output terminal CROUT.

The seventh transistor M7 can be in an on state under the control of the signal of the output control node PO_1, so as to provide the signal of the third clock signal CLK3 to the cascade signal output terminal CROUT. The eighth transistor M8 can be in an on state under the control of the signal of the second node PD, so as to provide the signal of the third reference signal terminal VREF3 to the cascade signal output terminal CROUT.

Exemplarily described above are only specific structures of the circuits in the shift register. In specific implementation, the specific structures of the circuits are not limited to the foregoing structures provided in the embodiments of the present disclosure, and may also be other structures known to those skilled in the art, and are not limited herein.

In specific implementation, to ensure a unified manufacturing process, in the embodiments of the present disclosure, as shown in FIG. 4, all the switching transistors can be N-type transistors. It should be noted that the embodiments of the present disclosure are described merely by using an example in which the transistors in the shift register are N-type transistors. In the case where the transistors are P-type transistors, the design principle is same as in the present disclosure, and it also falls within the scope of the present disclosure.

It should be noted that in the embodiments of the present disclosure, when all the transistors are N-type transistors, the signal of the first reference signal terminal is a high-level signal, and the signal of the second reference signal terminal and the signal of the third reference signal terminal are low-level signals. When all the transistors are P-type transistors, the signal of the first reference signal terminal is a low-level signal, and the signal of the second reference signal terminal and the signal of the third reference signal terminal are high-level signals. It should be noted that the levels of the signals mentioned in the embodiments of the present disclosure only represent their logic levels, and are not values of voltages actually applied for the signals during specific implementation.

Generally, the time of a frame during display driving may include a display scanning phase and a blanking time phase. In specific implementation, in the display scanning phase, signal timings of the first clock signal terminals are same, and signal timings of the second clock signal terminals are same, and the signal timings of the first clock signal terminals are same as that of the third clock signal terminal. The signal timings of the first clock signal terminals are different from those of the second clock signal terminals. For example, as shown in FIG. 5, the signal timing of the first clock signal terminal CLK1_1 is different from that of the second clock signal terminal CLK2_1, and the signal timing of the first clock signal terminal CLK1_1 is same as that of the third clock signal terminal CLK3.

It should be noted that voltage values of high-level signals mentioned in the embodiment of the present disclosure are same. For example, a voltage value of a high level of the input signal terminal INPUT, a voltage value of a high level of the first clock signal terminal CLK1_1, a voltage value of a high level of the second clock signal terminal CLK2_1 and a voltage value of the first reference signal terminal VREF1 are same. Further, voltage values of low-level signals mentioned in the embodiments of the present disclosure may also be same. For example, a voltage value of a low level of the input signal terminal INPUT, a voltage value of a low level of the first clock signal terminal CLK1_1, a voltage value of a low level of the second clock signal terminal CLK2_1, and a voltage value of the second reference signal terminal VREF2 and a voltage value of the third reference signal terminal VREF3 are same.

To reduce the number of signal terminals and the space occupied by signal lines, the second reference signal terminal VREF2 and the third reference signal terminal VREF3 can be set as a same signal terminal; that is, a same reference signal terminal is used to provide a signal of the second reference signal terminal VREF2 and a signal of the third reference signal terminal VREF3. Alternatively, voltage values of the second reference signal terminal VREF2 and the third reference signal terminal VREF3 may also be different, which is not limited herein.

Figure 5:
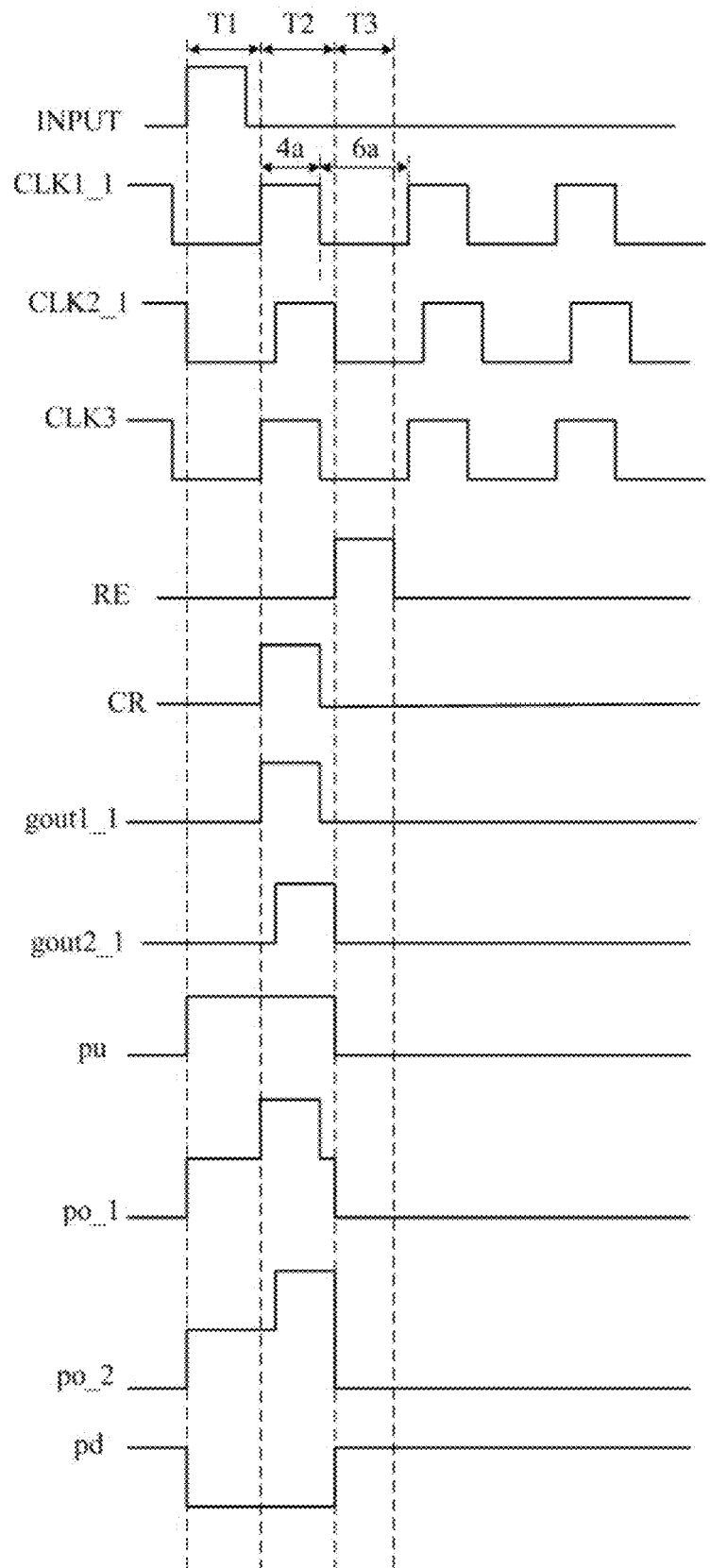
FIG. 5 is a circuit timing diagram provided in some embodiments of the present disclosure.

In specific implementation, as shown in FIG. 5, the cycles of the first clock signal terminal CLK1_$n$, the second clock signal terminal CLK2_$k$, and the third clock signal terminal CLK3 are same. For example, in one cycle, the duration of a high-level signal of the first clock signal terminal CLK1_$n$ can be 4a and the duration of a low-level signal thereof can be 6a. Thus, the duration of one cycle of the signal of the first clock signal terminal CLK1_$n$ is 10a. In one cycle, the duration of a high-level signal of the second clock signal terminal CLK2_$n$ can be 4a, and the duration of a low-level signal thereof can be 6a. Thus, the duration of one cycle of the signal of the second clock signal terminal CLK2_$n$ is 10a. In one cycle, the duration of a high-level signal of the third clock signal terminal CLK3 can be 4a, and the duration of a low-level signal thereof can be 6a. Thus, the duration of one cycle of the signal of the third clock signal terminal CLK3 is also 10a.

Further, in specific implementation, in the shift register provided in the embodiments of the present disclosure, an N-type transistor is turned on by a high-level signal and is cut off by a low-level signal; and a P-type transistor is turned on by a low-level signal and is cut off by a high-level signal. In specific implementation, a first electrode of a transistor can be used as a source and a second electrode thereof can be used as a drain, or a first electrode of a transistor can be used as a drain and a second electrode thereof can be used as a source. They are not differentiated specifically herein.

A working process of the above-mentioned shift register provided in the embodiments of the present disclosure is described below in conjunction with a circuit timing diagram, that is, FIG. 5, by using the structure of the shift register shown in FIG. 4 as an example. In the following description, the numeral 1 denotes a high-level signal, and 0 denotes a low-level signal, where 1 and 0 represent their logic levels, only to better explain the working process of the above-mentioned shift register provided in the embodiments of the present disclosure, and are not values of voltages applied to the gates of the transistors in specific implementation.

Specifically, an input phase T1, an output phase T2, and a reset phase T3 are selected in the circuit timing diagram shown in FIG. 5.

In the input phase T1, INPUT=1, CLK1_1=0, CLK2_1=0, CLK3=0, and RE=0.

Since INPUT=1, the ninth transistor M9 is turned on to provide a high level of the first reference signal terminal VREF1 to the first node PU, so that the signal of the first node PU is a high-level signal. As the signal of the first node PU is a high-level signal, the fifteenth transistor M15 is turned on to provide a low level of the third reference signal terminal VREF3 to the second node PD, so that the signal of the second node PD is a low-level signal. Thus, the fourth transistor M4, the sixth transistor M6, the eighth transistor M8, the twelfth transistor M12 and the thirteenth transistor M13 are all controlled to be cut off. As the first transistor M1 and the second transistor M2 form a diode connection structure, the signals of the output control nodes PO_1 and PO_2 are also high-level signals.

As the signal of the output control node PO_1 is a high-level signal, the third transistor M3 and the seventh transistor M7 are turned on, and the turned-on seventh transistor M7 provides a low level of the third clock signal terminal CLK3 to the cascade signal output terminal CROUT to output a low-level cascade signal CR. The turned-on third transistor M3 provides a low level of the first clock signal terminal CLK1_1 to the first sub-scan signal output terminal GOUT1_1 to output a low-level scan signal gout1_1, and the first capacitor C1 is charged.

As the signal of the output control node PO_2 is a high-level signal, the fifth transistor M5 is turned on to provide a low level of the second clock signal terminal CLK2_1 to the second sub-scan signal output terminal GOUT2_1 to output a low-level scan signal gout2_1, and the second capacitor C2 is charged. In addition, since RE=0, the tenth transistor M10 and the eleventh transistor M11 are both cut off.

In the output phase T2, INPUT=0, CLK1_1=1, CLK2_1=0, CLK3=1, and RE=0.

Since INPUT=1, the ninth transistor M9 is cut off, and the first node PU is in a floating state.

Due to the effect of the first capacitor C1, the output control node PO_1 is kept at a high-level signal to control the third transistor M3 and the seventh transistor M7 to be turned on. The turned-on seventh transistor M7 provides a high level of the third clock signal terminal CLK3 to the cascade signal output terminal CROUT, and the turned-on third transistor M3 provides a high level of the first clock signal terminal CLK1_1 to the first sub-scan signal output terminal GOUT1_1, so that the output control node PO_1 is further pulled up, and the third transistor M3 provides the high level of the first clock signal terminal CLK1_1 to the first sub-scan signal output terminal GOUT1_1 to output a high-level scan signal gout1_1; and the seventh transistor M7 provides the high level of the third clock signal terminal CLK3 to the cascade signal output terminal CROUT to output a high-level cascade signal CR.

Due to the effect of the second capacitor C2, the output control node PO_2 is kept at a high-level signal to control the fifth transistor M5 to be turned on, so that a low level of the second clock signal terminal CLK2_1 is provided to the second sub-scan signal output terminal. GOUT2_1 to output a low-level scan signal gout2_1. As the signal of the first node PU is a high-level signal, the signal of the second node PD is a low-level signal, so as to control the fourth transistor M4, the sixth transistor M6, the eighth transistor M8, the twelfth transistor M12 and the thirteen transistors M13 to be cut off.

When the level of the output control node PO_1 is further pulled up, as the first transistor M1 forms a diode connection, the first node PU and the output control node PO_1 can be disconnected, thereby avoiding an influence on the signal of the output control node PO_2 when the output control node PO_1 is further pulled up.

Then, the second clock signal terminal CLK2_1 is changed from a low-level signal to a high-level signal, that is, from CLK2_1=0 to CLK2_1=1, and other signals remain unchanged. At that time, as the fifth transistor M5 provides a high level of the second clock signal terminal CLK2_1 to the second sub-scan signal output terminal GOUT2_1, the level of the output control node PO_2 can be pulled up due to the effect of the second capacitor C2, so that a high level of the second clock signal terminal CLK2_1 is provided to the second sub-scan signal output terminal GOUT2_1 through the fifth transistor M5, to output a high-level scan signal gout2_1.

When the level of the output control node PO_2 is pulled up, as the second transistor M2 forms a diode connection, the first node PU and the output control node PO_2 can be disconnected, thereby avoiding an influence on the signal of the output control node PO_1 when the output control node PO_2 is pulled up.

Then, the first clock signal terminal CLK1_1 is changed from a high-level signal to a low-level signal, that is, from CLK1_1=1 to CLK1_1=0, and other signals remain unchanged. Thus, the third transistor M3 provides a low level of the first clock signal terminal CLK1_1 to the first sub-scan signal output terminal GOUT1_1 to output a low-level scan signal gout1_1.

In the reset phase T3, INPUT=0 and RE=1.

Since INPUT=0, the ninth transistor M9 is cut off, and since RE=1, the tenth transistor M10 and the eleventh transistor M11 are both turned on.

The turned-on tenth transistor M10 provides a low level of the third reference signal terminal VREF3 to the output control node PO_1, so that the signal of the output control node PO_1 is a low-level signal, and the turned-on eleventh transistor M11 provides the low level of the reference signal terminal VREF3 to the output control node PO_2, so that the signal of the output control node PO_2 is a low-level signal, and the first node PU can be discharged to a low-level signal. Thus, due to the effect of the fourteenth transistor M14 and the fifteenth transistor M15, the second node PD may have a high-level signal.

As the signal of the second node PD is a high-level signal, the fourth transistor M4, the sixth transistor M6, the eighth transistor M8, the twelfth transistor M12 and the thirteenth transistor M13 are all controlled to be turned on.

The turned-on fourth transistor M4 provides a low level of the second reference signal terminal VREF2 to the first sub-scan signal output terminal GOUT1_1 to output a low-level scan signal gout1_1. The turned-on sixth transistor M6 provides the low level of the second reference signal terminal VREF2 to the second sub-scan signal output terminal GOUT2_1 to output a low-level scan signal gout2_1. The turned-on eighth transistor M8 provides the low level of the third reference signal terminal VREF3 to the cascade signal output terminal CROUT to output a low-level cascade signal CR. The turned-on twelfth transistor M12 provides the low level of the third reference signal terminal VREF3 to the output control node PO_1, and further the signal of the output control node PO_1 is of a low level. The turned-on thirteenth transistor M13 provides the low level of the third reference signal terminal VREF3 to the output control node PO_2, and further the signal of the output control node PO_2 is of a low level.

After the reset phase T3, since INPUT=0 and RE=0, the signal of the output control node PO_1 is maintained at a low-level signal through the first capacitor C1, and the signal of the output control node PO_2 is maintained at a low-level signal and the signal of the second node PD is maintained at a high-level signal through the second capacitor C2, so as to control the fourth transistor M4, the sixth transistor M6, the eighth transistor M8, the twelfth transistor M12, and the thirteenth transistor M13 to be turned on.

The turned-on fourth transistor M4 provides a low level of the second reference signal terminal VREF2 to the first sub-scan signal output terminal GOUT1_1 to output a low-level scan signal gout1_1. The turned-on sixth transistor M6 provides the low level of the second reference signal terminal VREF2 to the second sub-scan signal output terminal GOUT2_1 to output a low-level scan signal gout2_1. The turned-on eighth transistor M8 provides a low level of the third reference signal terminal VREF3 to the cascade signal output terminal CROUT to output a low-level cascade signal CR. The turned-on twelfth transistor M12 provides the low level of the third reference signal terminal VREF3 to the output control node PO_1, and further the signal of the output control node PO_1 is of a low level. The turned-on thirteenth transistor M13 provides the low level of the third reference signal terminal VREF3 to the output control node PO_2, and further the signal of the output control node PO_2 is of a low level.

Figure 6:
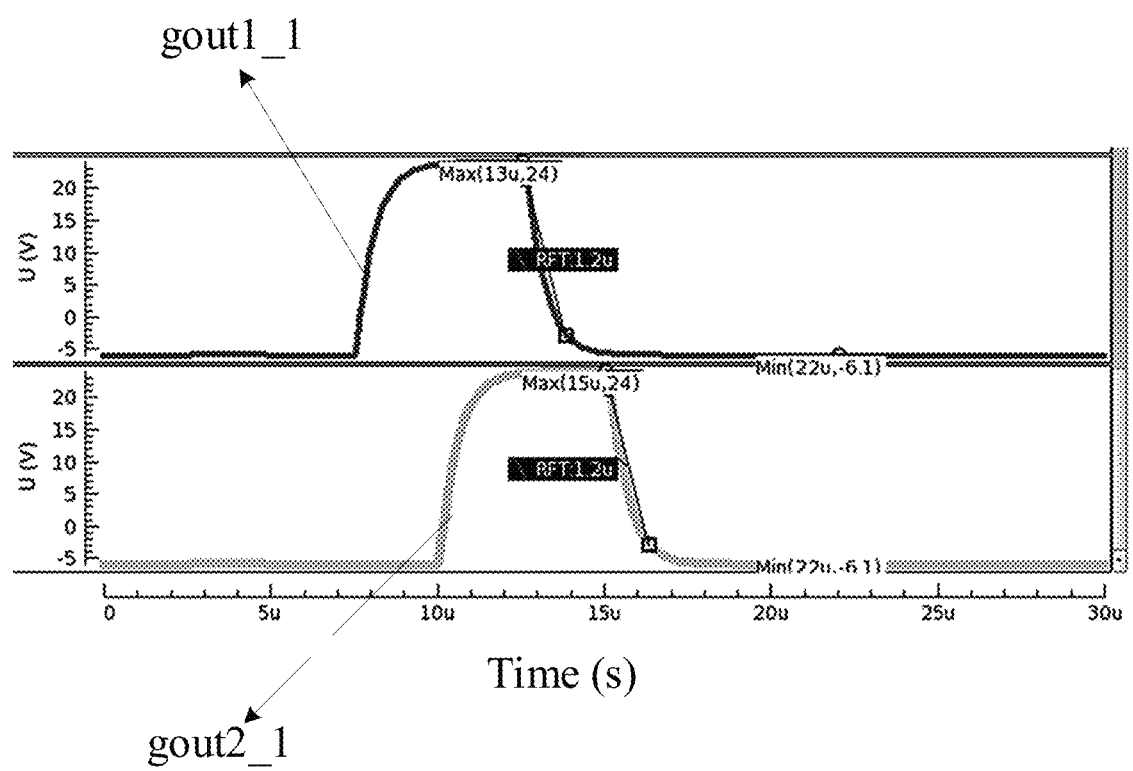
FIG. 6 is a simulation timing diagram obtained after the shift register shown in FIG. 4 is simulated.

In addition, in the shift register provided by the present disclosure, the signals of different output control nodes can have no influence on each other, so the stability of the waveforms of the output scan signals can be improved, and the difference in the waveforms of the scan signals can be avoided. The shift register in embodiment 1 is simulated to obtain a simulation diagram as shown in FIG. 6. It can be seen from FIG. 6 that the time duration for the scan signal gout1_1 and the scan signal gout2_1 to be converted from a high-level signal to a low-level signal is 12 us, so that the waveforms of the scan signal gout1_1 and the scan signal gout2_1 can have a high similarity and a small difference.

In practical applications, when the shift register in embodiment 1 is applied to an array substrate of a display device, as the array substrate includes a plurality of gate lines, scan signals with a phase difference is output to two gate lines by the shift register in embodiment 1. The display device may be an organic light-emitting diode (OLED), or the display device may also be a liquid crystal display (LCD), which is not limited herein.

Embodiment 2

Same portions of a shift register provided in embodiment 2 of the present disclosure as those of the shift register provided in embodiment 1 are not repeated here, and only the different portions are described below.

Figure 7:
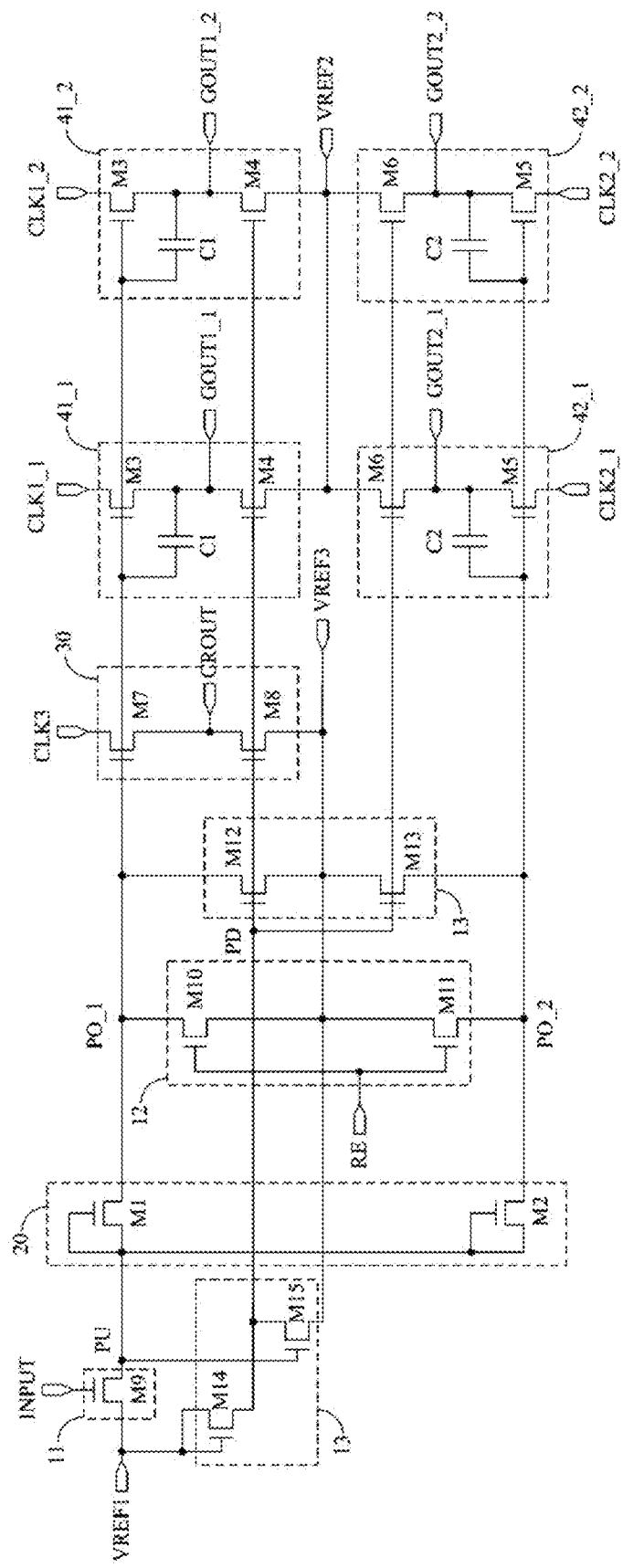
FIG. 7 is another specific structure diagram of a shift register provided in some embodiments of the present disclosure.

In specific implementation, in the embodiments of the present disclosure, as shown in FIG. 7, the shift register is provided with two first sub-scan signal output circuits 41_1 and 41_2, and two second sub-scan signal output circuits 42_1 and 42_2.

The first sub-scan signal output circuit 41_1 corresponds to a first clock signal terminal CLK1_1 and to a first sub-scan signal output terminal GOUT1_1. The first sub-scan signal output circuit 41_2 corresponds to a first clock signal terminal CLK1_2 and to a first sub-scan signal output terminal GOUT1_2. The second sub-scan signal output circuit 42_1 corresponds to a second clock signal terminal CLK2_1 and to a second sub-scan signal output terminal GOUT2_1. The second sub-scan signal output circuit 42_2 corresponds to a second clock signal terminal CLK2_2 and to a second sub-scan signal output terminal GOUT2_2.

Figure 8:
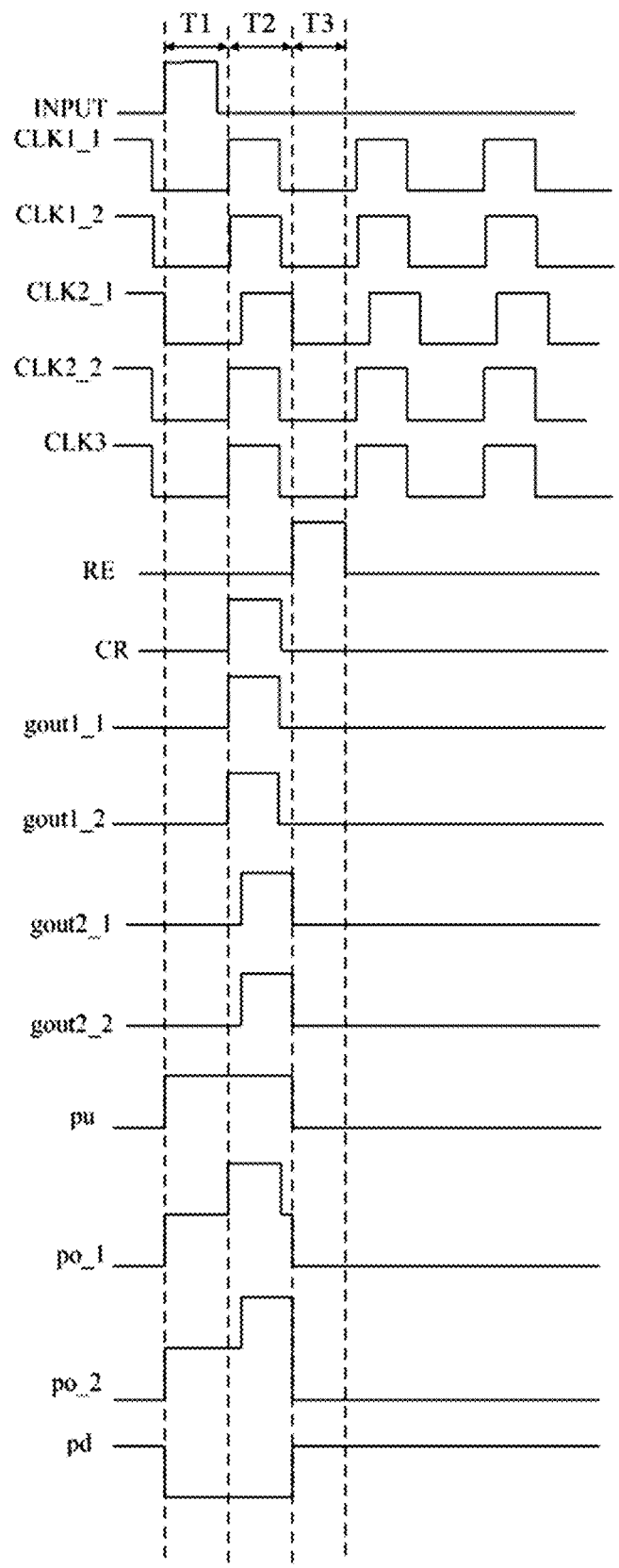
FIG. 8 is another circuit timing diagram provided in some embodiments of the present disclosure.

A working process of the above-mentioned shift register provided in the embodiments is described below in conjunction with a circuit timing diagram shown in FIG. 8. Specifically, an input phase T1, an output phase T2, and a reset phase T3 are selected in the circuit timing diagram shown in FIG. 8.

In the input phase T1, INPUT=1, CLK1_1=0, CLK1_2=0, CLK2_1=0, CLK2_2=0, CLK3=0, and RE=0. The following description is only directed to a third transistor M3, a fourth transistor M4 and a first capacitor C1 in the first sub-scan signal output circuit 41_2, and a fifth transistor M5, a sixth transistor M6 and a second capacitor C2 in the second sub-scan signal output circuit 42_2. The remaining working process in this phase can be substantially same as that in the input phase T1 in embodiment 1, and details are not described herein.

Specifically, as the signal of the output control node PO_1 is a high-level signal, the third transistor M3 is turned on to provide a low level of the first clock signal terminal CLK1_2 to the first sub-scan signal output terminal GOUT1_2 so as to output a low-level scan signal gout1_2, and the first capacitor C1 is charged. As the signal of the output control node PO_2 is a high-level signal, the fifth transistor M5 is turned on to provide a low level of the second clock signal terminal CLK2_2 to the second sub-scan signal output terminal GOUT2_2 so as to output a low-level scan signal gout2_2, and the second capacitor C2 is charged.

In the output phase T2, INPUT=0, CLK1_1=1, CLK1_2=1, CLK2_1=0, CLK2_2=0, CLK3=1, and RE=0. The following description is only directed to the third transistor M3, the fourth transistor M4 and the first capacitor C1 in the first sub-scan signal output circuit 41_2, and the fifth transistor M5, the sixth transistor M6 and the second capacitor C2 in the second sub-scan signal output circuit 42_2. The remaining working process in this phase can be substantially same as that in the output phase T2 in the embodiment 1, and details are not described herein.

As the level of the output control node PO_1 is further pulled up, a high level of the first clock signal terminal CLK1_2 is provided to the first sub-scan signal output terminal GOUT1_2 through the third transistor M3 to output a high-level scan signal gout1_2. Then, the second clock signal terminal CLK2_2 is changed from a low-level signal to a high-level signal. As the level of the output control node PO_2 is pulled up, a high level of the second clock signal terminal CLK2_2 is provided to the second sub-scan signal output terminal GOUT2_2 through the fifth transistor M5 to output a high-level scan signal gout2_2. Then, the first clock signal terminal CLK1_2 is changed from a high-level signal to a low-level signal, that is, from CLK1_2=1 to CLK1_2=0, and the remaining signals remain unchanged. Thus, the third transistor M3 provides a low level of the first clock signal terminal CLK1_2 to the first sub-scan signal output terminal GOUT1_2 to output a low-level scan signal gout1_2.

In the reset phase T3, INPUT=0 and RE=1. The following description is only directed to the third transistor M3, fourth transistor M4 and the first capacitor C1 in the first sub-scan signal output circuit 41_2, and the fifth transistor M5, the sixth transistor M6 and the second capacitor C2 in the second sub-scan signal output circuit 42_2. The remaining working process in this phase can be substantially same as that in the reset phase T3 in the embodiment 1, and details are not described herein.

The third transistor M3 and the fifth transistor M5 are both cut off, and the fourth transistor M4 and the sixth transistor M6 are both turned on. The turned-on fourth transistor M4 provides a low level of the second reference signal terminal VREF2 to the first sub-scan signal output terminal GOUT1_2 to output a low-level scan signal gout1_2. The turned-on sixth transistor M6 provides the low level of the second reference signal terminal VREF2 to the second sub-scan signal output terminal GOUT2_2 to output a low-level scan signal gout2_2.

After the reset phase T3, INPUT=0 and RE=0. The following description is only directed to the third transistor M3, the fourth transistor M4 and the first capacitor C1 in the first sub-scan signal output circuit 41_2, and the fifth transistor M5, the sixth transistor M6 and the second capacitor C2 in the second sub-scan signal output circuit 42_2.

The third transistor M3 and the fifth transistor M5 are both cut off, and the fourth transistor M4 and the sixth transistor M6 are both turned on. The turned-on fourth transistor M4 provides a low level of the second reference signal terminal VREF2 to the first sub-scan signal output terminal GOUT1_2 to output a low-level scan signal gout1_2. The turned-on sixth transistor M6 provides the low level of the second reference signal terminal VREF2 to the second sub-scan signal output terminal GOUT2_2 to output a low-level scan signal gout2_2.

In this way, the first sub-scan signal output circuit 41_1 and the first sub-scan signal output circuit 41_2 can output scan signals with same timing and waveform, and thus the two scan signals can be input into a same gate line of a row to improve the driving ability. Likewise, the second sub-scan signal output circuit 42_1 and the second sub-scan signal output circuit 42_2 can output scan signals with same timing and waveform, and thus the two scan signals can be input to a same gate line of the next row to improve the driving ability.

Embodiment 3

Same portions of a shift register provided in embodiment 3 of the present disclosure as those of the shift register provided in embodiment 2 are not repeated here, and only the different portions are described below.

Figure 9:
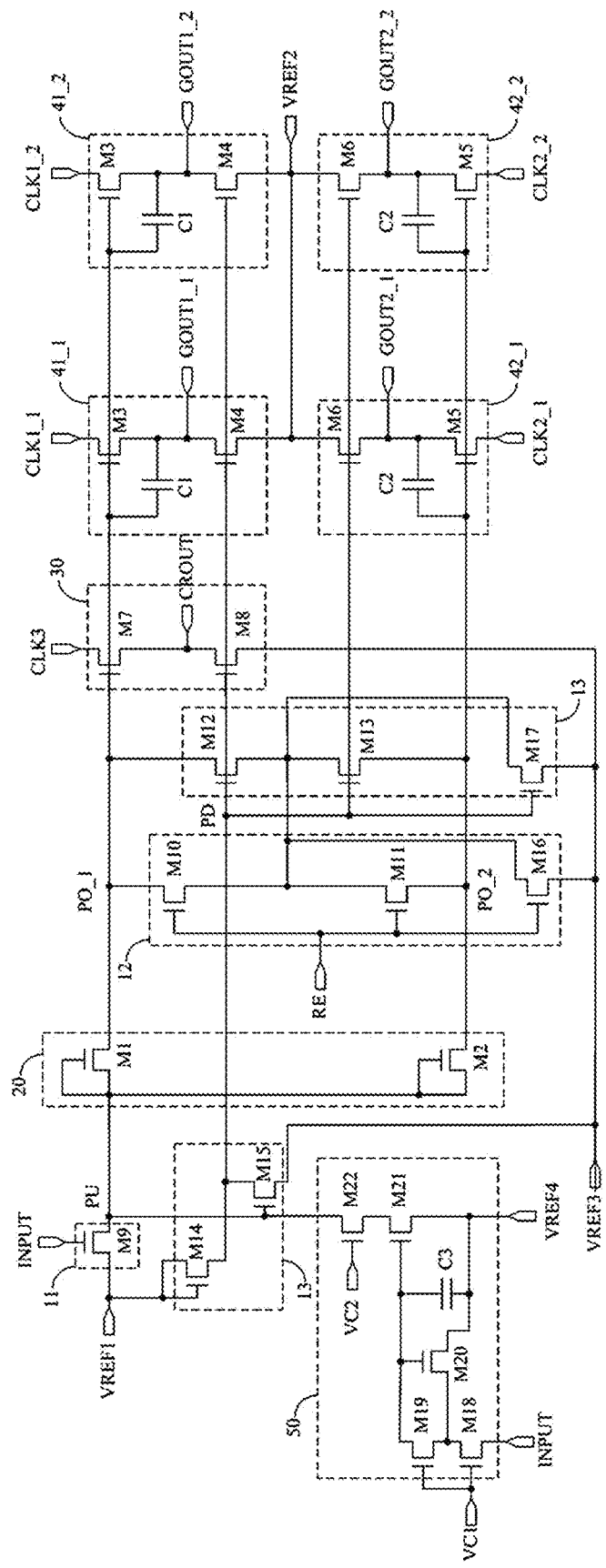
FIG. 9 is yet another specific structure diagram of a shift register provided in some embodiments of the present disclosure.

In specific implementation, two scan signal output circuits are provided. In the embodiment of the present disclosure, as shown in FIG. 9, the reset circuit 12 can further include a sixteenth transistor M16. The first electrode of the tenth transistor M10 and the first electrode of the eleventh transistor M11 respectively receive a signal of the third reference signal terminal VREF3 through the sixteenth transistor M16. A gate of the sixteenth transistor M16 is configured to receive a signal of the reset signal terminal RE, and a first electrode of the sixteenth transistor M16 is configured to receive the signal of the third reference signal terminal VREF3, and a second electrode of the sixteenth transistor M16 is coupled to the first electrode of the tenth transistor M10 and the first electrode of the eleventh transistor M11, respectively. When the sixteenth transistor M16 is in an on state under the control of the high-level signal of the reset signal terminal RE, the signal of the third reference signal terminal VREF3 can be provided to the first electrode of the tenth transistor M10 and the first electrode of the eleventh transistor M11, respectively. In this way, the influence of the signal change at the third reference signal terminal VREF3 on the tenth transistor M10 and the eleventh transistor M11 can be avoided, and the circuit stability can be improved.

In specific implementation, in the embodiment of the present disclosure, as shown in FIG. 9, the node control circuit 13 further includes a seventeenth transistor M17. The first electrode of the twelfth transistor M12 and the first electrode of the thirteenth transistor M13 respectively receive a signal of the third reference signal terminal VREF3 through the seventeenth transistor M17. A gate of the seventeenth transistor M17 is coupled to the second node PD, and a first electrode of the seventeenth transistor M17 is configured to receive the signal of the third reference signal terminal VREF3, and a second electrode of the seventeenth transistor M17 is coupled to the first electrode of the twelfth transistor M12 and the first electrode of the thirteenth transistor M13, respectively. When the seventeenth transistor M17 is in an on state under the control of a high-level signal of the second node PD, the signal of the third reference signal terminal VREF3 can be provided to the first electrode of the twelfth transistor M12 and the first electrode of the thirteen transistor M13, respectively. In this way, the influence of the signal change at the third reference signal terminal VREF3 on the twelfth transistor M12 and the thirteenth transistor M13 can be avoided, and the circuit stability can be improved.

Figure 10:
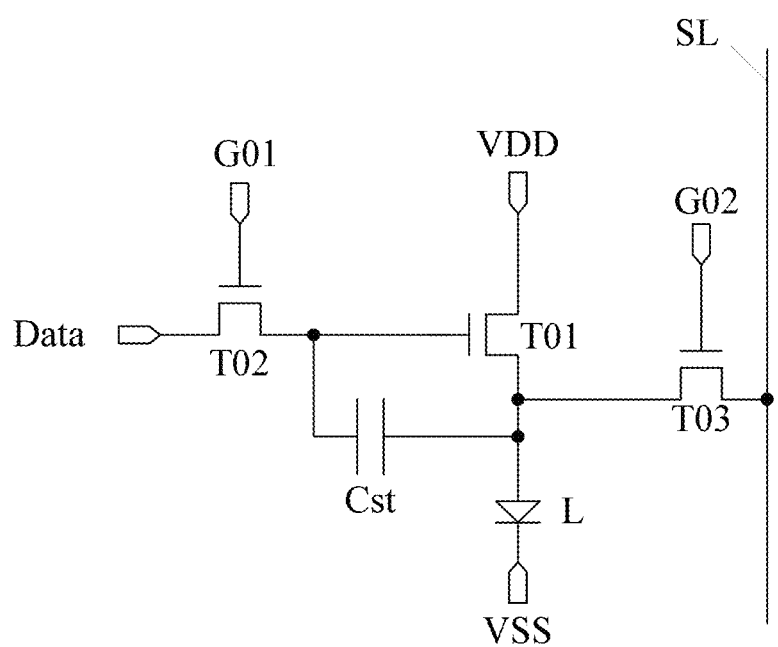
FIG. 10 is a structure diagram of a pixel circuit provided in some embodiments of the present disclosure.

Generally in an OLED display device, a pixel circuit in the form of 3T1C shown in FIG. 10 is used to drive an OLED to emit light and perform external threshold compensation on the OLED.

The pixel circuit includes a driving transistor T01, transistors T02-T03, and a storage capacitor Cst. In the pixel circuit, the transistor T02 is controlled to be turned on to write a data voltage at a data signal terminal Data into a gate of the driving transistor T01, and the driving transistor T01 is controlled to generate an operating current to drive the organic light emitting diode L to emit light.

The transistor T03 outputs a signal carrying threshold voltage information of the driving transistor T01 through a detection line SL. Thus, a row of pixel circuit needs to correspond to two gate lines to respectively input signals G01 and G02.

To control the above-mentioned pixel circuit, in specific implementation, in the embodiment of the present disclosure, as shown in FIG. 9, the shift register can further include a detection circuit 50. The detection circuit 50 can include an eighteenth transistor M18, a nineteenth transistor M19, a twentieth transistor M20, a twenty-first transistor M21, a twenty-second transistor M22 and a third capacitor C3.

A gate of the eighteenth transistor M18 is configured to receive a signal of a first detection control signal terminal VC1, a first electrode of the eighteenth transistor M18 is configured to receive a signal of an input signal terminal INPUT, and a second electrode of the eighteenth transistor M18 is coupled to a first electrode of the twentieth transistor M20.

A gate of the nineteenth transistor M19 is configured to receive the signal of the first detection control signal terminal VC1, and a first electrode of the nineteenth transistor M19 is coupled to a gate of the twenty-first transistor M21, and a second electrode of the nineteenth transistor M19 is coupled to the first electrode of the twentieth transistor M20.

A gate of the twentieth transistor M20 is coupled to the gate of the twenty-first transistor M21, and a second electrode of the twentieth transistor M20 is configured to receive a signal of a fourth reference signal terminal VREF4.

A first electrode of the twenty-first transistor M21 is configured to receive the signal of the fourth reference signal terminal VREF4, and a second electrode of the twenty-first transistor M21 is coupled to a first electrode of the twenty-second transistor M22.

A gate of the twenty-second transistor M22 is configured to receive a signal of a second detection control signal terminal VC2, and a second electrode of the twenty-second transistor M22 is coupled to the first node PU.

The third capacitor C3 is coupled between the first electrode of the twenty-first transistor M21 and the gate of the twenty-first transistor M21.

Specifically, the eighteenth transistor M18 can be in an on state under the control of the first detection control signal terminal VC1 to provide the signal of the input signal terminal INPUT to the first electrode of the twentieth transistor M20 and the second electrode of the nineteenth transistor M19. The nineteenth transistor M19 can be in an on state under the control of the first detection control signal terminal VC1 to provide a signal of its second electrode to the gate of the twenty-first transistor M21 and the gate of the twentieth transistor M20. The twentieth transistor M20 can be in an on state under the control of a signal of its gate. The twenty-first transistor M21 can be in an on state under the control of a signal of its gate, to provide the signal of the fourth reference signal terminal VREF4 to the first electrode of the twenty-second transistor M22. The twenty-second transistor M22 can be in an on state under the control of the second detection control signal terminal VC2 to provide a signal of its first electrode to the first node PU.

In specific implementation, the fourth reference signal terminal can be loaded with a high-level signal. Further, the voltage value of the fourth reference signal terminal can be same as that of the first reference signal terminal. To reduce the number of signal terminals and the space occupied by signal lines, the fourth reference signal terminal and the first reference signal terminal can be set as a same signal terminal, that is, the same reference signal terminal is used to provide the signals of the fourth and first reference signal terminals.

Figure 11:
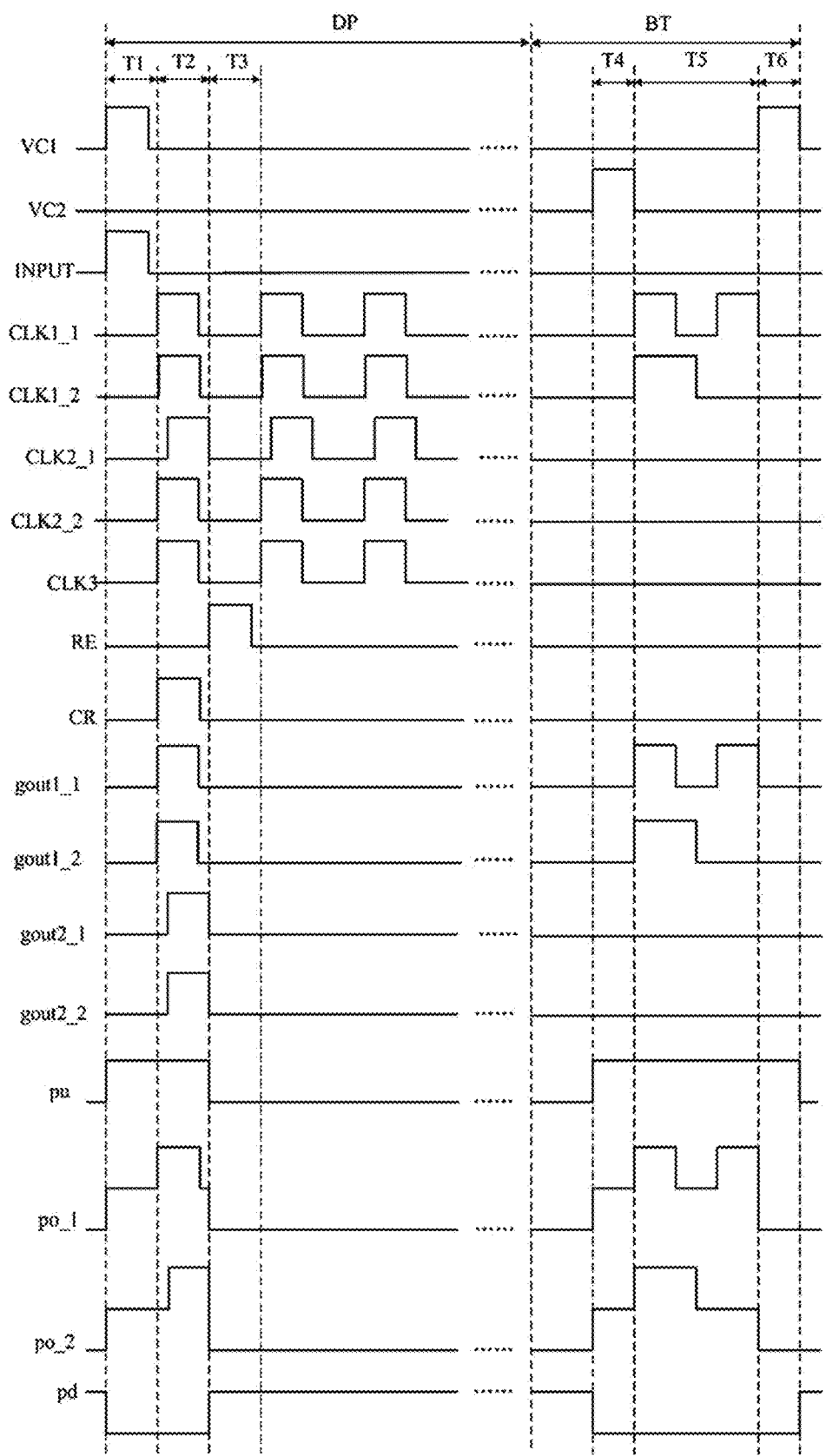
FIG. 11 is yet another circuit timing diagram provided in some embodiments of the present disclosure.

A working process of the above-mentioned shift register provided in the embodiment is described below in conjunction with a circuit timing diagram shown in FIG. 11. Specifically, the time of a frame is divided into a display scanning phase DP and a blanking time phase BT. Signal timings of the first clock signal terminals CLK1_$n$ in the display scanning phase DP are same, and signal timings of the first clock signal terminals CLK1_$n$ in the blanking time phase BT are different. Similarly, signal timings of the second clock signal terminals CLK2_$n$ in the display scanning phase DP are same, and signal timings of the second clock signal terminals CLK2_$n$ in the blanking time phase BT are different.

Specifically, the display scanning phase DP includes an input phase T1, an output phase T2 and a reset phase T3.

In the input phase T1, INPUT=1, CLK1_1=0, CLK1_2=0, CLK2_1=0, CLK2_2=0, CLK3=0, RE=0, VC1=1, and VC2=0. Since RE=0, the sixteenth transistor M16 is cut off. As the signal of the second node PD is a low-level signal, the seventeenth transistor M17 is cut off. Since VC1=1, the eighteenth transistor M18 and the nineteenth transistor M19 are both turned on, so that the high-level signal of the input signal terminal INPUT is provided to the gate of the twenty-first transistor M21 and maintained by the third capacitor C3, and the twenty-first transistor M21 is controlled to be turned on to provide a high level of the fourth reference signal terminal VREF4 to the twenty-second transistor M22. As VC2=0, the twenty-second transistor M22 is cut off, so that the signal of the first node PU is not affected. The remaining working process in this phase can be substantially same as that in the input phase T1 in embodiment 2, and details are not described herein. Moreover, the working processes of the output phase T2 and the reset phase T3 in embodiment 3 can be substantially same as those of the output phase T2 and the reset phase T3 in embodiment 2, and details are not described herein.

The blanking time phase BT includes a detection input phase T4, a detection output phase T5, and a detection reset phase T6. In the blanking time period BT, the input signal terminal INPUT, the reset signal terminal RE, the second clock signal terminals CLK2_1-CLK2_2, the third clock signal terminal CLK3, and the first to fourth reference signal terminals VREF4 are all loaded with low-level signals.

In the detection input phase T4, VC1=0, VC2=1, CLK1_1=0, and CLK1_2=0. Since VC1=0, the eighteenth transistor M18 and the nineteenth transistor M19 are both cut off Due to the effect of the third capacitor C3, the gate of the twenty-first transistor M21 has a high-level signal so that the twenty-first transistor M21 is controlled to be turned on, and as VC2=1, the twenty-second transistor M22 is turned on to provide a high level of the fourth reference signal terminal VREF4 is to the first node PU. As the signal of the first node PU is a high-level signal, the fifteenth transistor M15 is turned on, so that the signal of the second node PD is a low-level signal. Thus, the fourth transistor M4, the sixth transistor M6, the eighth transistor M8, the twelfth transistor M12 and the thirteenth transistor M13 are all controlled to be cut off.

As the signal of the first node PU is a high-level signal, and the first transistor M1 and the second transistor M2 form a diode connection structure, the signals of the output control nodes PO_1 and PO_2 are also high-level signals.

As the signal of the output control node PO_1 is a high-level signal, the seventh transistor M7 and the two third transistors M3 are all turned on. The turned-on seventh transistor M7 provides a low level of the third clock signal terminal CLK3 to the cascade signal output terminal CROUT to output a low-level cascade signal CR.

The third transistor M3 in the first sub-scan signal output circuit 41_1 provides a signal of the first clock signal terminal CLK1_1 to the first sub-scan signal output terminal GOUT1_1 to output a low-level scan signal gout1_1. The third transistor M3 in the first sub-scan signal output circuit 41_2 provides a signal of the first clock signal terminal CLK1_2 to the first sub-scan signal output terminal GOUT1_2 to output a low-level scan signal gout1_2.

As the signal of the output control node PO_2 is a high-level signal, the two fifth transistors M5 are turned on. The fifth transistor M5 in the second sub-scan signal output circuit 42_1 provides a signal of the second clock signal terminal CLK2_1 to the second sub-scan signal output terminal GOUT2_1 to output a low-level scan signal gout2_1. The fifth transistor M5 in the second sub-scan signal output circuit 42_2 provides a signal of the second clock signal terminal CLK2_2 to the second sub-scan signal output terminal GOUT2_2 to output a low-level scan signal gout2_2.

In the detection output phase T5, VC1=0, VC2=0, the first clock signal terminal CLK1_1 has two high-level pulses, and the first clock signal terminal CLK1_2 has one high-level pulse.

Specifically, due to the effect of the first capacitor C1, the signal of the output control node PO_1 is maintained as a high-level signal, so the seventh transistor M7 and the two third transistors M3 are all turned on.

The third transistor M3 in the first sub-scan signal output circuit 41_1 provides a signal of the first clock signal terminal CLK1_1 to the first sub-scan signal output terminal GOUT1_1 to output a scan signal gout1_1 with two high-level pulses. The third transistor M3 in the first sub-scan signal output circuit 41_2 provides a signal of the first clock signal terminal CLK1_2 to the first sub-scan signal output terminal GOUT1_2 to output a scan signal gout1_2 with one high-level pulse. The turned-on seventh transistor M7 provides a high level of the third clock signal terminal CLK3 to the cascade signal output terminal CROUT to output a high-level cascade signal CR. Due to the effect of the second capacitor C2, the signal of the output control node PO_2 is maintained as a high-level signal, so the two fifth transistors M5 are turned on. The fifth transistor M5 in the second sub-scan signal output circuit 42_1 provides a signal of the second clock signal terminal CLK2_1 to the second sub-scan signal output terminal GOUT2_1 to output a low-level scan signal gout2_1. The fifth transistor M5 in the second sub-scan signal output circuit 42_2 provides a signal of the second clock signal terminal CLK2_2 to the second sub-scan signal output terminal GOUT2_2 to output a low-level scan signal gout2_2.

In the detection reset phase T6, VC1=1, VC2=0, CLK1_1=0, and CLK1_2=0.

Since VC2=0, the twenty-second transistor M22 is cut off. Since VC1=1, the eighteenth transistor M18 and the nineteenth transistor M19 are turned on to provide a low level of the input signal terminal INPUT to the gate of the twenty-first transistor M21 and control the twenty-first transistor M21 to be cut off.

Due to the effect of the first capacitor C1, the signal of the output control node PO_1 is maintained as a high-level signal, so the seventh transistor M7 and the two third transistors M3 are all turned on.

The third transistor M3 in the first sub-scan signal output circuit 41_1 provides a low level of the first clock signal terminal CLK1_1 to the first sub-scan signal output terminal GOUT1_1 to output a low-level scan signal gout1_1. The third transistor M3 in the first sub-scan signal output circuit 41_2 provides a low level of the first clock signal terminal CLK1_2 to the first sub-scan signal output terminal GOUT1_2 to output a low-level scan signal gout1_2. The turned-on seventh transistor M7 provides a low level of the third clock signal terminal CLK3 to the cascade signal output terminal CROUT to output a low-level cascade signal CR.

Due to the effect of the second capacitor C2, the signal of the output control node PO_2 is maintained as a high-level signal, so the two fifth transistors M5 are turned on. The fifth transistor M5 in the second sub-scan signal output circuit 42_1 provides a signal of the second clock signal terminal CLK2_1 to the second sub-scan signal output terminal GOUT2_1 to output a low-level scan signal gout2_1. The fifth transistor M5 in the second sub-scan signal output circuit 42_2 provides the signal of the second clock signal terminal CLK2_2 to the second sub-scan signal output terminal GOUT2_2 to output a low-level scan signal gout2_2.

Generally, the OLED is detected for external compensation in the blanking time period. In this way, the scan signals gout1_1 and gout1_2 output by the shift register in embodiment 3 are used to input signals G01 and G02 to two gate lines in a row, respectively, so as to control the OLED in the row to achieve a display function in the display scanning phase in a frame, and control the OLED in the row is controlled to achieve an external compensation detection function in the blanking time period; and the scan signals gout2_1 and gout2_2 are used to input signals G01 and G02 to two gate lines in the next row, respectively, so as to meet the display requirement of the OLED.

Embodiment 4

Same portions of a shift register provided in embodiment 4 of the present disclosure as those of the shift register provided in embodiment 3 are not repeated here, and only the different portions are described below.

Figure 12:
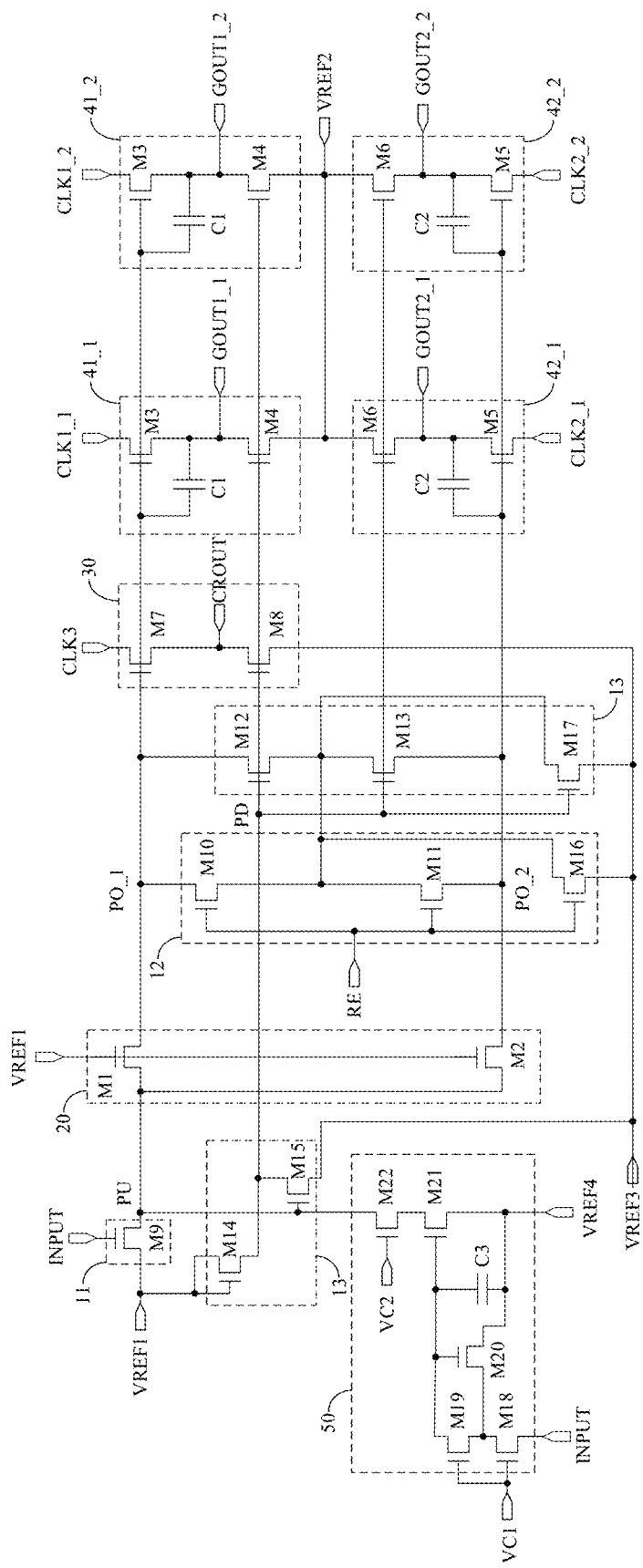
FIG. 12 is still another specific structure diagram of a shift register provided in some embodiments of the present disclosure.

In specific implementation, two scan signal output circuits are provided. In the embodiment of the present disclosure, as shown in FIG. 12, the branch control circuit 20 may include a first transistor M1 and a second transistor M2.

A gate of the first transistor M1 is configured to receive the signal of the first reference signal terminal VREF1, and a first electrode of the first transistor M1 is coupled to the first node PU, and a second electrode of the first transistor M1 is coupled to the output control node PO_1 corresponding to the first scan signal output circuit. A gate of the second transistor M2 is configured to receive the signal of the first reference signal terminal VREF1, and a first electrode of the second transistor M2 is coupled to the first node PU, and a second electrode of the second transistor M2 is coupled to the output control node PO_2 corresponding to the second scan signal output circuit.

In specific implementation, the first reference signal terminal has a high-level signal in the display scanning phase DP and the blanking time phase BT. Moreover, a voltage value of the first reference signal terminal, a voltage value of the first clock signal terminal and a voltage value of the second clock signal terminal are same. Thus, in the input phase T1, when the first node PU has a high-level signal, the voltage value of the gate of the first transistor M1 is the same as that of its first electrode, which is equivalent to forming a diode connection structure, and the voltage value of the gate of the second transistor M2 is same as that of its first electrode, which is equivalent to forming a diode connection structure. The remaining work process in this phase can be substantially same as that in the input phase T1 in embodiment 3, and details are not described herein.

In the output phase T2, as the output control signals PO_1-PO_2 are pulled up, gate-source voltages of the first transistor M1 and the second transistor M2 are large, causing the first transistor M1 and the second transistor M2 to be cut off, which allows the pull-up output control signals PO_1-PO_2 not to influence each other through the first node PU, thereby improving the circuit stability. The remaining work process in this phase can be substantially same as that in the output phase T2 in embodiment 3, and details are not described herein.

In the reset phase T3, the first transistor M1 and the second transistor M2 are always turned on. The remaining work process in this phase can be substantially same as that in the reset phase T3 in embodiment 3, and details are not described herein.

In the detection input phase T4, the detection output phase T5 and the detection reset phase T6, the first transistor M1 and the second transistor M2 are always turned on. The remaining work processes of the three phases are substantially same as those in the detection input phase T4, the detection output phase T5 and the detection reset phase T6 in embodiment 3, and details are not described herein.

Based on the same inventive concept, embodiments of the present disclosure also provide a driving method of the shift register provided in the embodiments of the present disclosure. By using the driving method to drive the shift register provided in the embodiments of the present disclosure, a plurality of different scan signals can be output by the shift register. Moreover, for the implementation of the driving method, reference can be made to the foregoing implementation of the shift register, and repeated description is omitted here.

In specific implementation, in the embodiments of the present disclosure, the display scanning phase can include an input phase, an output phase and a reset phase. Specifically, as shown in FIG. 13, the method includes the following steps.

S1301: in the input phase, the signal control circuit controls a signal of a first node and a signal of a second node in response to a signal of the input signal terminal; the branch control circuit controls signals of output control nodes in one-to-one correspondence with the scan signal output circuits in response to the signal of the first node; the cascade signal output circuit controls the cascade signal output terminal to output a cascade signal in response to the signal of one output control node; and each of the scan signal output circuits outputs a different scan signal in response to the signal of the corresponding output control node.

S1302: in the output phase, the branch control circuit controls signals of the output control nodes in one-to-one correspondence with the scan signal output circuits in response to a signal of the first node; the cascade signal output circuit controls the cascade signal output terminal to output a cascade signal in response to the signal of one output control node; and each of the scan signal output circuits outputs a different scan signal in response to the signal of the corresponding output control node.

S1303: in the reset phase, the signal control circuit controls signals of the first node and the second node in response to a reset signal; the cascade signal output circuit controls the cascade signal output terminal to output a cascade signal in response to a signal of one output control node; and each of the scan signal output circuits outputs a different scan signal in response to a signal of a corresponding output control node.

In specific implementation, two scan signal output circuits are provided. The first scan signal output circuit of the two scan signal output circuits includes a plurality of first sub-scan signal output circuits; and the second scan signal output circuit includes a plurality of second sub-scan signal output circuits. It should be noted that, for detailed description of this part, please refer to embodiment 1, and details are not described herein.

In the embodiments of the present disclosure, in the input phase and the output phase, each of the first sub-scan signal output circuits provides a corresponding first clock signal to a corresponding first sub-scan signal output terminal in response to a signal of a corresponding output control node; each of the second sub-scan signal output circuits provides a corresponding second clock signal to a corresponding second sub-scan signal output terminal in response to a signal of a corresponding output control node; and the cascade signal output circuit provides a third clock signal to the cascade signal output terminal in response to a signal of the first output terminal of the branch control circuit.

In the reset phase, each of the first sub-scan signal output circuits provides a second reference signal to a corresponding first sub-scan signal output terminal in response to a signal of the second node; each of the second sub-scan signal output circuits provides the second reference signal to a corresponding second sub-scan signal output terminal in response to the signal of the second node; and the cascade signal output circuit provides a third reference signal to the cascade signal output terminal in response to a signal of the first output terminal of the branch control circuit.

In the embodiments of the present disclosure, in the display scanning phase, signal timings of the first clock signal terminals are same, and signal timings of the second clock signal terminals are same, and the signal timings of the first clock signal terminals are different from those of the second clock signal terminals.

Further, in specific implementation, the shift register further includes a detection circuit, so that the shift register can be applied to an OLED display device. In the embodiment of the present disclosure, the driving method further includes a blanking time phase, where the blanking time phase includes a detection input phase, a detection output phase, and a detection reset phase. For the working process of the detection circuit in these phases, please refer to embodiment 3, and details are not described herein.

Figure 14A:
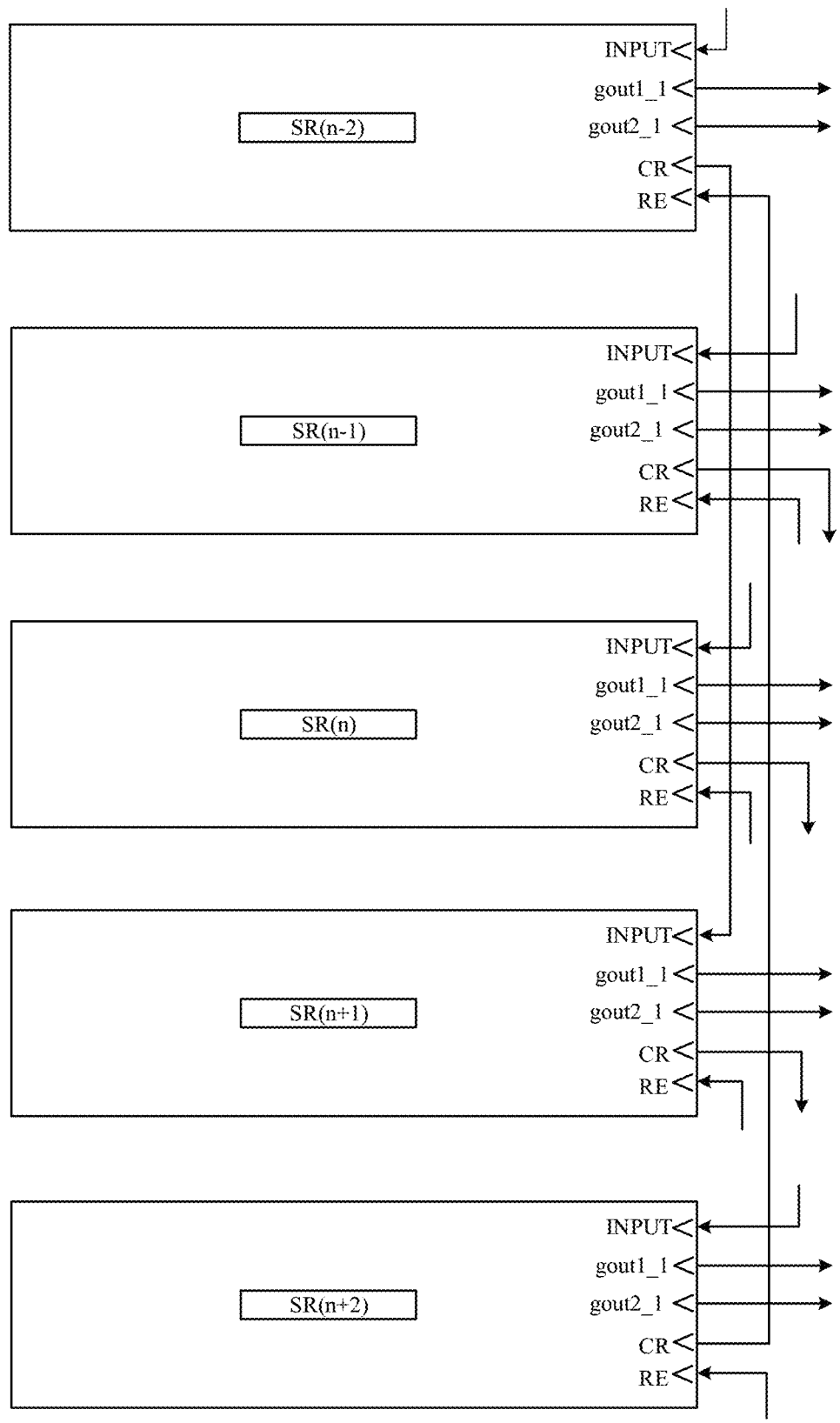
FIG. 14A is a structure diagram of a gate drive circuit provided in some embodiments of the present disclosure.
Figure 14B:
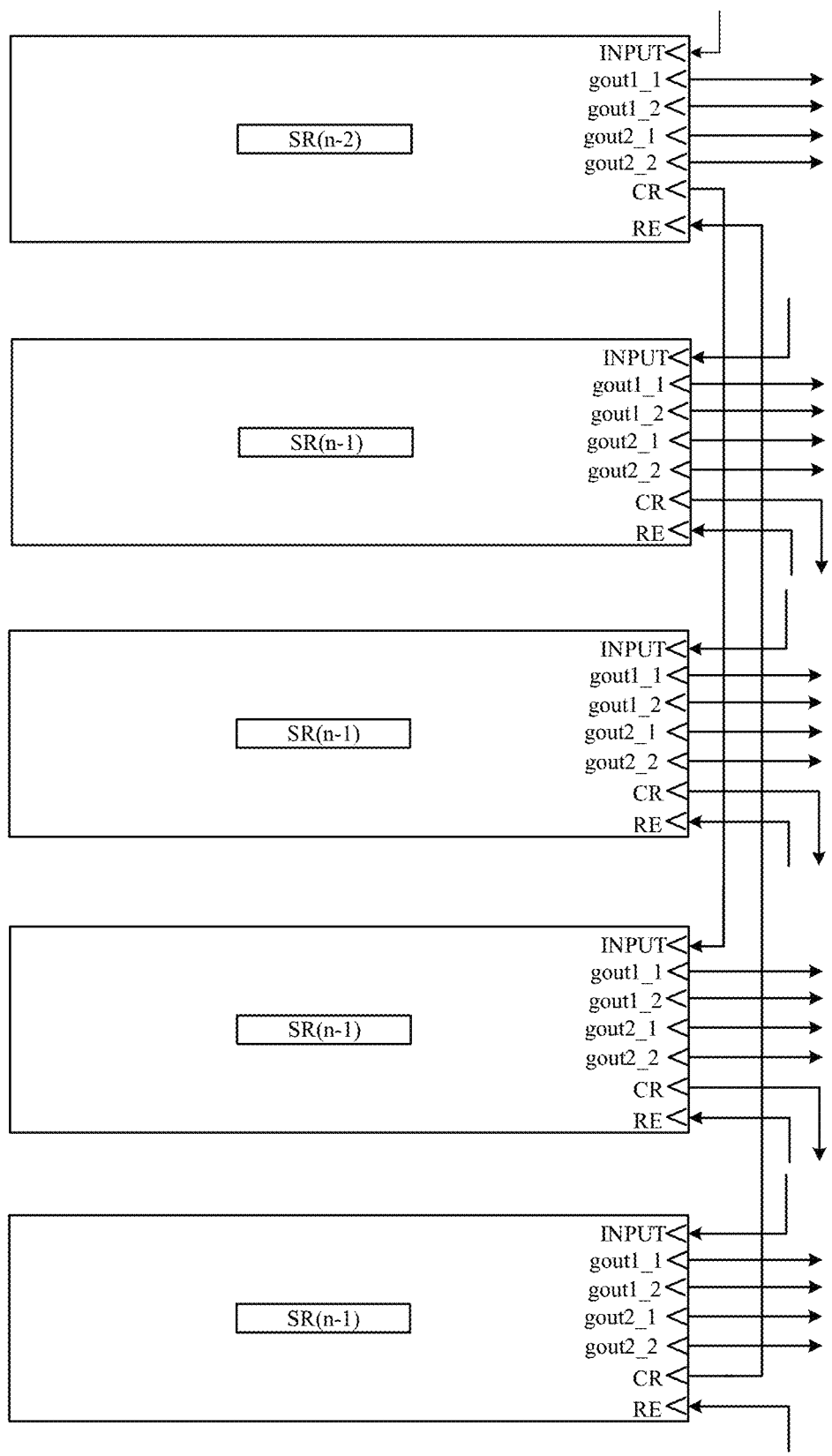
FIG. 14B is another structure diagram of a gate drive circuit provided in some embodiments of the present disclosure.

Based on the same inventive concept, the embodiments of the present disclosure also provide a gate drive circuit, as shown in FIGS. 14A and 14B, including a plurality of cascaded shift registers provided in embodiments of the present disclosure: SR (n−2), SR (n−1), SR (n), SR (n+1), SR (n+2) (N shift registers in total, where $1 \leq n \leq N$ and n is an integer).

An input signal of a first-stage shift register is input by a frame start signal terminal.

In every adjacent four stages of shift registers, an input signal terminal INPUT of a fourth-stage shift register SR(n+1) is input by a cascade signal CR of the first-stage shift register SR(n−2).

In every adjacent five stages of shift registers, a reset signal terminal RE of the first-stage shift register SR(n−2) is input by a cascade signal CR of a fifth-stage shift register SR(n+2).

It should be noted that FIG. 14A is described by using an example in which the structure shown in FIG. 4 is used as the structure of a shift register. FIG. 14B is described by using an example in which the structure shown in FIG. 9 is used as the structure of a shift register.

In specific implementation, when the structure shown in FIG. 4 is used as the structure of a shift register, in a 5y-4 stage shift register, a first clock signal terminal CLK1_1 is provided by a same clock signal line clk1_1, a second clock signal terminal CLK2_1 is provided by a same clock signal line clk2_1, and a third clock signal terminal CLK3 is provided by a same clock signal line clk3_1.

In a 5y-3 stage shift register, a first clock signal terminal CLK1_1 is provided by a same clock signal line clk1_2, a second clock signal terminal CLK2_1 is provided by a same clock signal line clk2_2, and a third clock signal terminal CLK3 is provided by a same clock signal line clk3_2.

In a 5y-2 stage shift register, a first clock signal terminal CLK1_1 is provided by a same clock signal line clk1_3, a second clock signal terminal CLK2_1 is provided by a same clock signal line clk2_3, and a third clock signal terminal CLK3 is provided by a same clock signal line clk3_3.

In a 5y-1 stage shift register, a first clock signal terminal CLK1_1 is provided by a same clock signal line clk1_4, a second clock signal terminal CLK2_1 is provided by a same clock signal line clk2_4, and a third clock signal terminal CLK3 is provided by a same clock signal line clk3_4.

In a 5y-stage shift register, a first clock signal terminal CLK1_1 is provided by a same clock signal line clk1_5, a second clock signal terminal CLK2_1 is provided by a same clock signal line clk2_5, and a third clock signal terminal CLK3 is provided by a same clock signal line clk3_5. Here, k is a positive integer.

In specific implementation, when the structure shown in FIG. 9 is used as the structure of a shift register, in a 5y-4 stage shift register, a first clock signal terminal CLK1_1 is provided by a same clock signal line clk1_11, a first clock signal terminal CLK1_2 is provided by a same clock signal line clk1_21, a second clock signal terminal CLK2_1 is provided by a same clock signal line clk2_11, a second clock signal terminal CLK2_2 is provided by a same clock signal line clk2_21, and a third clock signal terminal CLK3 is provided by a same clock signal line clk3_1.

In a 5y-3 stage shift register, a first clock signal terminal CLK1_1 is provided by a same clock signal line clk1_12, a first clock signal terminal CLK1_2 is provided by a same clock signal line clk1_22, a second clock signal terminal CLK2_1 is provided by a same clock signal line clk2_12, a second clock signal terminal CLK2_2 is provided by a same clock signal line clk2_22, and a third clock signal terminal CLK3 is provided by a same clock signal line clk3_2.

In a 5y-2 stage shift register, a first clock signal terminal CLK1_1 is provided by a same clock signal line clk1_13, a first clock signal terminal CLK1_2 is provided by a same clock signal line clk1_23, a second clock signal terminal CLK2_1 is provided by a same clock signal line clk2_13, a second clock signal terminal CLK2_2 is provided by a same clock signal line clk2_23, and a third clock signal terminal CLK3 is provided by a same clock signal line clk3_3.

In a 5y-1 stage shift register, a first clock signal terminal CLK1_1 is provided by a same clock signal line clk1_14, a first clock signal terminal CLK1_2 is provided by a same clock signal line clk1_24, a second clock signal terminal CLK2_1 is provided by a same clock signal line clk2_14, a second clock signal terminal CLK2_2 is provided by a same clock signal line clk2_24, and a third clock signal terminal CLK3 is provided by a same clock signal line clk3_4.

In a 5y-stage shift register, a first clock signal terminal CLK1_1 is provided by a same clock signal line clk1_15, a first clock signal terminal CLK1_2 is provided by a same clock signal line clk1_25, a second clock signal terminal CLK2_1 is provided by a same clock signal line clk2_15, a second clock signal terminal CLK2_2 is provided by a same clock signal line clk2_25, and a third clock signal terminal CLK3 is provided by a same clock signal line clk3_5. Here, k is a positive integer.

In specific implementation, first detection control signals of the shift registers in the stages are a same signal, so as to control the shift registers of the stages within the time of a frame. A second detection control signal of the shift register of each stage is different. Within the time of a frame, only the second detection control signal terminal corresponding to the shift register in one stage has a high-level pulse signal, so that the shift register in the stage outputs the scan signals gout1_1, gout1_2, gout2_1, and gout2_2 shown in FIG. 11 in the blanking time phase. Other shift registers output low-level signals in the blanking time phase.

Specifically, the specific structure of each shift register in the above-mentioned gate drive circuit is functionally and structurally same as that of the above-mentioned shift register in the present disclosure, and repeated description is omitted.

Based on the same inventive concept, an embodiment of the present disclosure also provides an array substrate, including the gate drive circuit provided in the embodiments of the present disclosure. The problem solving principle of the array substrate is similar to that of the foregoing gate drive circuit. Therefore, for implementation of the array substrate, reference can be made to the implementation of the foregoing gate drive circuit, and repeated description is omitted here.

The above-mentioned array substrate provided in an embodiment of the present disclosure includes the foregoing gate drive circuit, and scan signals are provided to gate lines on the array substrate through the shift registers of the stages in the gate drive circuit. For specific implementation, reference can be made to the description of the foregoing shift register, and repeated description is omitted here.

Based on the same disclosed concept, an embodiment of the present disclosure further provides a display device, including the foregoing array substrate provided in an embodiment of the present disclosure. The display device can be a mobile phone, a tablet computer, a television, a display, a notebook computer, a digital photo frame, a navigator, or any other product or component with a display function. Other indispensable components of the display device are those understandable by those skilled in the art, and are not described herein, nor should they be construed as limiting the present disclosure. For the implementation of the display device, reference can be made to the embodiment of the foregoing array substrate, and repeated description is omitted here.

In the shift register, the driving method thereof, the gate drive circuit, the array substrate and the display device provided in the embodiments of the present disclosure, the signal control circuit controls the signal of the first node and the signal of the second node in response to the input signal and the reset signal. The branch control circuit is configured to control the signals of the output control nodes in one-to-one correspondence with the scan signal output circuits in response to the signal of the first node. In this way, the different output control nodes can be separated, so that when the signal of an output control node changes, the signal(s) of other output control node(s) can be unaffected. The cascade signal output circuit outputs the cascade signal in response to the signal of the output control node corresponding to the first scan output circuit in the plurality of scan signal output circuits and the signal of the second node PD, so as to provide an input signal to a next-stage shift register. The plurality of scan signal output circuits are provided so that each scan signal output circuit outputs a different scan signal in response to the signal of the corresponding output control node and the signal of the second node. This allows each shift register to output multiple scan signals to correspond to different gate lines in a display panel. This can reduce the number of shift registers in a gate drive circuit and the space occupied by the gate drive circuit, and can achieve an ultra-narrow frame design, as compared with an existing shift register that can only output one scan signal. Moreover, as the signals of different output control nodes do not influence each other, the output stability can also be improved.

Apparently, those skilled in the art can make changes and modifications to the present disclosure without departing from the spirit and scope of the present disclosure. Thus, the present disclosure is also intended to encompass these changes and modifications if such changes and modifications of the present disclosure are within the scope of the claims of the present disclosure and equivalents thereof.

The invention claimed is:

1. A shift register, comprising:
  a signal control circuit coupled to an input signal terminal and a reset signal terminal;
  a branch control circuit coupled to a first output terminal of the signal control circuit;
  a cascade signal output circuit coupled to a cascade signal output terminal and a second output terminal of the signal control circuit; and
  at least two scan signal output circuits, wherein one of the at least two scan signal output circuits is coupled to the second output terminal of the signal control circuit, at least one corresponding scan signal output terminal, and one corresponding output terminal of the branch control circuit;
  wherein the cascade signal output circuit is directly coupled to one output terminal of the branch control circuit.

2. The shift register according to claim 1, wherein the at least two scan signal output circuits comprise two scan signal output circuits, which are a first scan signal output circuit and a second scan signal output circuit;
  the first scan signal output circuit is coupled to a first output terminal of the branch control circuit; and the second scan signal output circuit is coupled to a second output terminal of the branch control circuit.

3. The shift register according to claim 2, wherein the branch control circuit comprises a first transistor and a second transistor;
  under the control of an effective level, the first transistor communicates the first output terminal of the signal control circuit with the first output terminal of the branch control circuit; and
  under the control of an effective level, the second transistor communicates the first output terminal of the signal control circuit with the second output terminal of the branch control circuit.

4. The shift register according to claim 3, wherein a gate of the first transistor and a first electrode of the first transistor are coupled to the first output terminal of the signal control circuit, and a second electrode of the first transistor is the first output terminal of the branch control circuit; and
  a gate of the second transistor and a first electrode of the second transistor are coupled to the first output terminal of the signal control circuit, and a second electrode of the second transistor is the second output terminal of the branch control circuit.

5. The shift register according to claim 3, wherein a gate of the first transistor is coupled to a first reference signal terminal, a first electrode of the first transistor is coupled to the first output terminal of the signal control circuit, and a second electrode of the first transistor is the first output terminal of the branch control circuit; and
  a gate of the second transistor is coupled to the first reference signal terminal, a first electrode of the second transistor is coupled to the first output terminal of the signal control circuit, and a second electrode of the second transistor is the second output terminal of the branch control circuit.

6. The shift register according to claim 2, wherein
  the first scan signal output circuit comprises at least one first sub-scan signal output circuit, wherein one of the at least one first sub-scan signal output circuit is coupled to a second reference signal terminal, one corresponding first clock signal terminal, and one corresponding first sub-scan signal output terminal, respectively; and
  the second scan signal output circuit comprises at least one second sub-scan signal output circuit, wherein one of the at least one second sub-scan signal output circuit is coupled to a second reference signal terminal, one corresponding second clock signal terminal, and one corresponding second sub-scan signal output terminal, respectively.

7. The shift register according to claim 6, wherein the first sub-scan signal output circuit comprises a third transistor, a fourth transistor and a first capacitor;
a gate of the third transistor is coupled to the first output terminal of the branch control circuit, a first electrode of the third transistor is coupled to the corresponding first clock signal terminal, and a second electrode of the third transistor is coupled to the corresponding first sub-scan signal output terminal;
a gate of the fourth transistor is coupled to the second output terminal of the signal control circuit, a first electrode of the fourth transistor is coupled to the second reference signal terminal, and a second electrode of the fourth transistor is coupled to the corresponding first sub-scan signal output terminal; and
the first capacitor is coupled between the gate of the third transistor and the corresponding first sub-scan signal output terminal.

8. The shift register according to claim 6, wherein the second sub-scan signal output circuit comprises a fifth transistor, a sixth transistor and a second capacitor;
a gate of the fifth transistor is coupled to the second output terminal of the branch control circuit, a first electrode of the fifth transistor is coupled to the corresponding second clock signal terminal, and a second electrode of the fifth transistor is coupled to the corresponding second sub-scan signal output terminal;
a gate of the sixth transistor is coupled to the second output terminal of the signal control circuit, a first electrode of the sixth transistor is coupled to the second reference signal terminal, and a second electrode of the sixth transistor is coupled to the corresponding second sub-scan signal output terminal; and
the second capacitor is coupled between the gate of the fifth transistor and the second sub-scan signal output terminal.

9. The shift register according to claim 2, wherein the cascade signal output circuit comprises a seventh transistor and an eighth transistor;
a gate of the seventh transistor is coupled to the first output terminal of the branch control circuit, a first electrode of the seventh transistor is coupled to a third clock signal terminal, and a second electrode of the seventh transistor is coupled to the cascade signal output terminal; and
a gate of the eighth transistor is coupled to the second output terminal of the signal control circuit, a first electrode of the eighth transistor is coupled to a third reference signal terminal, and a second electrode of the eighth transistor is coupled to the cascade signal output terminal.

10. The shift register according to claim 2, wherein the signal control circuit comprises an input circuit, a reset circuit, and a node control circuit;
the input circuit is coupled to the input signal terminal, a first reference signal terminal and the first output terminal of the signal control circuit, respectively;
the reset circuit is coupled to the reset signal terminal, a third reference signal terminal, and the first output terminal of the branch control circuit and the second output terminal of the branch control circuit, respectively; and
the node control circuit is coupled to the first reference signal terminal, the third reference signal terminal, the first output terminal of the signal control circuit and the second output terminal of the signal control circuit, and the first output terminal of the branch control circuit and the second output terminal of the branch control circuit, respectively.

11. The shift register according to claim 10, wherein
the input circuit comprises a ninth transistor, wherein a gate of the ninth transistor is coupled to the input signal terminal, a first electrode of the ninth transistor is coupled to the first reference signal terminal, and a second electrode of the ninth transistor is coupled to the first output terminal of the signal control circuit;
the reset circuit comprises a tenth transistor and an eleventh transistor, wherein a gate of the tenth transistor is coupled to the reset signal terminal, a first electrode of the tenth transistor is coupled to the third reference signal terminal, and a second electrode of the tenth transistor is coupled to the first output terminal of the branch control circuit; and a gate of the eleventh transistor is coupled to the reset signal terminal, a first electrode of the eleventh transistor is coupled to the third reference signal terminal, and a second electrode of the eleventh transistor is coupled to the second output terminal of the branch control circuit; and
the node control circuit comprises a twelfth transistor, a thirteenth transistor, a fourteenth transistor and a fifteenth transistor, wherein a gate of the twelfth transistor is coupled to the second output terminal of the signal control circuit, a first electrode of the twelfth transistor is coupled to the third reference signal terminal, and a second electrode of the twelfth transistor is coupled to the first output terminal of the branch control circuit; a gate of the thirteen transistor is coupled to the second output terminal of the signal control circuit, a first electrode of the thirteen transistor is coupled to the third reference signal terminal, and a second electrode of the thirteen transistor is coupled to the second output terminal of the branch control circuit; a gate of the fourteenth transistor and a first electrode of the fourteenth transistor are coupled to the first reference signal terminal, and a second electrode of the fourteenth transistor is coupled to the second output terminal of the signal control circuit; and a gate of the fifteenth transistor is coupled to the first output terminal of the signal control circuit, a first electrode of the fifteenth transistor is coupled to the third reference signal terminal, and a second electrode of the fifteenth transistor is coupled to the second output terminal of the signal control circuit.

12. The shift register according to claim 11, wherein
the reset circuit further comprises a sixteenth transistor, wherein the first electrode of the tenth transistor and the first electrode of the eleventh transistor are coupled to the third reference signal terminal through the sixteenth transistor; and a gate of the sixteenth transistor is coupled to the reset signal terminal; and
the node control circuit further comprises a seventeenth transistor, wherein the first electrode of the twelfth transistor and the first electrode of the thirteenth transistor are respectively coupled to the third reference signal terminal through the seventeenth transistor; and a gate of the seventeenth transistor is coupled to the second output terminal of the signal control circuit.

13. The shift register according to claim 1, further comprising a detection circuit, wherein the detection circuit comprises an eighteenth transistor, a nineteenth transistor, a twentieth transistor, a twenty-first transistor, a twenty-second transistor and a third capacitor;
- a gate of the eighteenth transistor is coupled to a first detection control signal terminal, a first electrode of the eighteenth transistor is coupled to the input signal terminal, and a second electrode of the eighteenth transistor is coupled to a first electrode of the twentieth transistor;
- a gate of the nineteenth transistor is coupled to the first detection control signal terminal, a first electrode of the nineteenth transistor is coupled to a gate of the twenty-first transistor, and a second electrode of the nineteenth transistor is coupled to the first electrode of the twentieth transistor;
- a gate of the twentieth transistor is coupled to the gate of the twenty-first transistor, and a second electrode of the twentieth transistor is coupled to a fourth reference signal terminal;
- a first electrode of the twenty-first transistor is coupled to the fourth reference signal terminal, and a second electrode of the twenty-first transistor is coupled to a first electrode of the twenty-second transistor;
- a gate of the twenty-second transistor is coupled to a second detection control signal terminal, and a second electrode of the twenty-second transistor is coupled to the first output terminal of the signal control circuit; and
- the third capacitor is coupled between the first electrode of the twenty-first transistor and the gate of the twenty-first transistor.

14. A gate drive circuit, comprising a plurality of cascaded shift registers according to claim 1, wherein
- an input signal terminal of a first-stage shift register is coupled to a frame start signal terminal;
- in every adjacent four stages of shift registers, an input signal terminal of a fourth-stage shift register is coupled to a cascade signal input terminal of the first-stage shift register; and
- in every adjacent five stages of shift registers, a reset signal terminal of the first-stage shift register is coupled to a cascade signal input terminal of a fifth-stage shift register.

15. An array substrate, comprising the gate drive circuit according to claim 14.

16. A display device, comprising the array substrate according to claim 15.

17. A driving method of the shift register according to claim 1, comprising a display scanning phase, wherein the display scanning phase comprises an input phase, an output phase and a reset phase;
- in the input phase, the signal control circuit controls a signal of the first output terminal of the signal control circuit and a signal of the second output terminal of the signal control circuit in response to a signal of the input signal terminal; the branch control circuit controls output signals of output terminals of the branch control circuit in response to the signal of the first output terminal of the signal control circuit; the cascade signal output circuit controls the cascade signal output terminal to output a cascade signal in response to the output signal of one output terminal of the branch control circuit; and each of the scan signal output circuits controls at least one corresponding scan signal output terminal to output a different scan signal in response to the signal of one corresponding output terminal of the branch control circuit;
- in the output phase, the branch control circuit controls output signals of output terminals of the branch control circuit in response to a signal of the first output terminal of the signal control circuit; the cascade signal output circuit controls the cascade signal output terminal to output a cascade signal in response to the output signal of one output terminal of the branch control circuit; and each of the scan signal output circuits controls at least one corresponding scan signal output terminal to output a different scan signal in response to the signal of one corresponding output terminal of the branch control circuit; and
- in the reset phase, the signal control circuit controls signals of the first output terminal and the second output terminal of the signal control circuit in response to a signal of the reset signal terminal; the cascade signal output circuit controls the cascade signal output terminal to output a cascade signal in response to the output signal of one output terminal of the branch control circuit; and each of the scan signal output circuits outputs a different scan signal in response to a signal of a corresponding output control node.

18. The driving method according to claim 17, wherein the scan signal output circuits comprise two scan signal output circuits, which are a first scan signal output circuit and a second scan signal output circuit; the first scan signal output circuit comprises a plurality of first sub-scan signal output circuits; and the second scan signal output circuit comprises a plurality of second sub-scan signal output circuits;
- in the input phase and the output phase, each of the first sub-scan signal output circuits provides a signal of a corresponding first clock signal terminal to a corresponding first sub-scan signal output terminal in response to a signal of a first output terminal of the branch control circuit; each of the second sub-scan signal output circuits provides a signal of a corresponding second clock signal terminal to a corresponding second sub-scan signal output terminal in response to a signal of a second output terminal of the branch control circuit; and the cascade signal output circuit provides a signal of a third clock signal terminal to the cascade signal output terminal in response to a signal of the first output terminal of the branch control circuit; and
- in the reset phase, each of the first sub-scan signal output circuits provides a signal of a second reference signal terminal to a corresponding first sub-scan signal output terminal in response to a signal of the second output terminal of the signal control circuit; each of the second sub-scan signal output circuits provides the signal of the second reference signal terminal to a corresponding second sub-scan signal output terminal in response to the signal of the second output terminal of the signal control circuit; and the cascade signal output circuit provides a signal of a third reference signal terminal to the cascade signal output terminal in response to the signal of the second output terminal of the signal control circuit.

19. The driving method according to claim 18, wherein in the display scanning phase, signal timings of the first clock signal terminals are same, and signal timings of the second clock signal terminals are same, and the signal timings of the first clock signal terminals are different from those of the second clock signal terminals.

* * * * *